United States Patent
Li et al.

(10) Patent No.: US 9,698,200 B2
(45) Date of Patent: Jul. 4, 2017

(54) MAGNETISM-CONTROLLABLE DUMMY STRUCTURES IN MEMORY DEVICE

(71) Applicant: GLOBALFOUNDRIES Singapore Pte. Ltd., Singapore (SG)

(72) Inventors: Pinghui Li, Singapore (SG); Ming Zhu, Singapore (SG); Shunqiang Gong, Singapore (SG); Wanbing Yi, Singapore (SG); Darin Chan, Santa Clara, CA (US); Yiang Aun Nga, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/287,771

(22) Filed: Oct. 7, 2016

(65) Prior Publication Data
US 2017/0104029 A1     Apr. 13, 2017

Related U.S. Application Data

(60) Provisional application No. 62/238,725, filed on Oct. 8, 2015.

(51) Int. Cl.
| | |
|---|---|
| *H01L 43/02* | (2006.01) |
| *H01L 43/12* | (2006.01) |
| *H01L 27/22* | (2006.01) |
| *H01L 43/08* | (2006.01) |
| *G11C 11/16* | (2006.01) |

(52) U.S. Cl.
CPC .......... *H01L 27/228* (2013.01); *G11C 11/161* (2013.01); *H01L 43/02* (2013.01); *H01L 43/08* (2013.01); *H01L 43/12* (2013.01)

(58) Field of Classification Search
CPC ....... H01L 27/228; H01L 43/02; H01L 43/08; H01L 43/12; G11C 11/161
USPC ................ 257/295, 421, 425, 427, E21.648, 257/E21.665, E29.323; 365/173; 428/832; 438/3, 253
See application file for complete search history.

(56) References Cited

U.S. PATENT DOCUMENTS

| | | | |
|---|---|---|---|
| 2011/0291209 A1* | 12/2011 | Takenaga | ............. H01L 27/228 257/421 |
| 2012/0228728 A1* | 9/2012 | Ueki | ...................... H01L 43/12 257/421 |

(Continued)

*Primary Examiner* — Dao H Nguyen
(74) *Attorney, Agent, or Firm* — Horizon IP Pte Ltd.

(57) ABSTRACT

A device and a method of forming a device are disclosed. The method includes providing a substrate defined with first and second functional regions and first and second non-functional regions. The first non-functional region corresponds to a proximate memory region which is proximate to and surrounds the first functional region and the second non-functional region corresponds to an external logic circuit region which surrounds at least the second functional region. A magnetic memory element is formed in the first functional region and a logic element is formed in the second functional region. A plurality of magnetism controllable dummy structures are formed in the proximate memory region and external logic circuit region. The magnetism controllable dummy structures provide uniform magnetic field to the magnetic memory element and prevents electrical-magnetic interaction between the magnetic memory and logic elements on the same substrate.

20 Claims, 21 Drawing Sheets

(56) References Cited

U.S. PATENT DOCUMENTS

| | | | |
|---|---|---|---|
| 2014/0264668 A1* | 9/2014 | Lee | H01L 43/12 |
| | | | 257/421 |
| 2014/0264679 A1* | 9/2014 | Lee | H01L 43/12 |
| | | | 257/427 |
| 2015/0221657 A1* | 8/2015 | Sashida | H01L 27/11507 |
| | | | 257/532 |
| 2016/0254440 A1* | 9/2016 | Wang | H01L 43/08 |
| | | | 257/421 |
| 2017/0018704 A1* | 1/2017 | Chuang | H01L 43/02 |

* cited by examiner

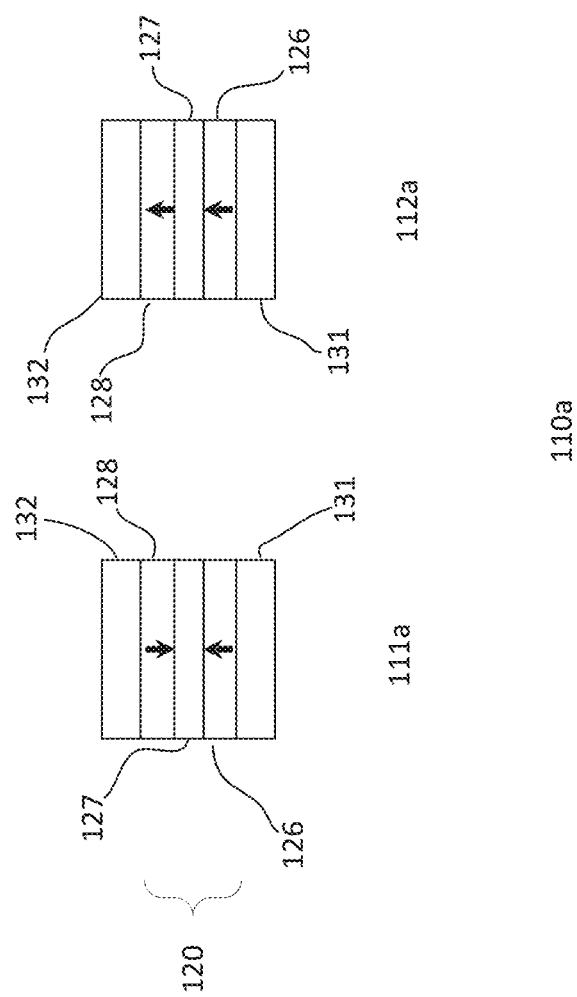

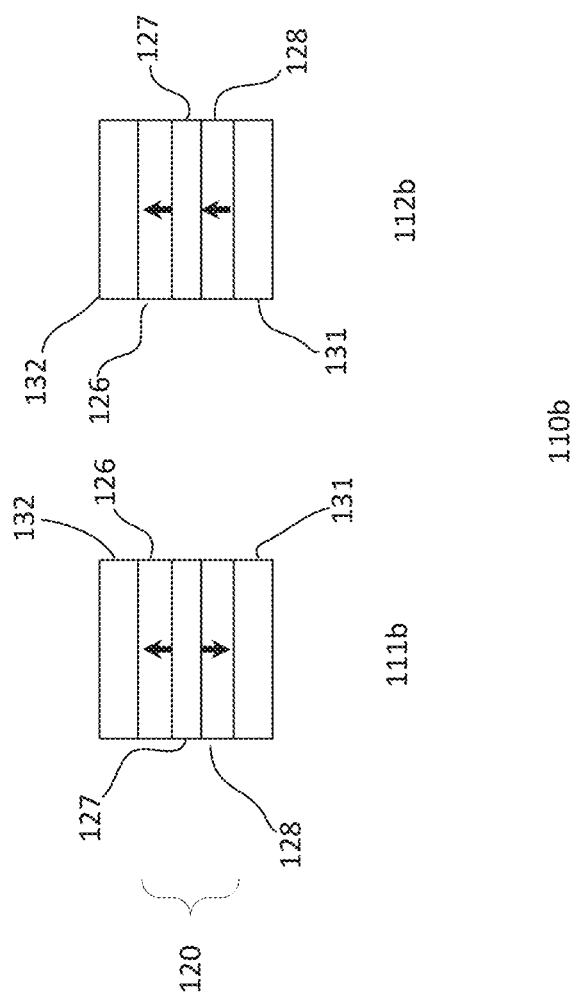

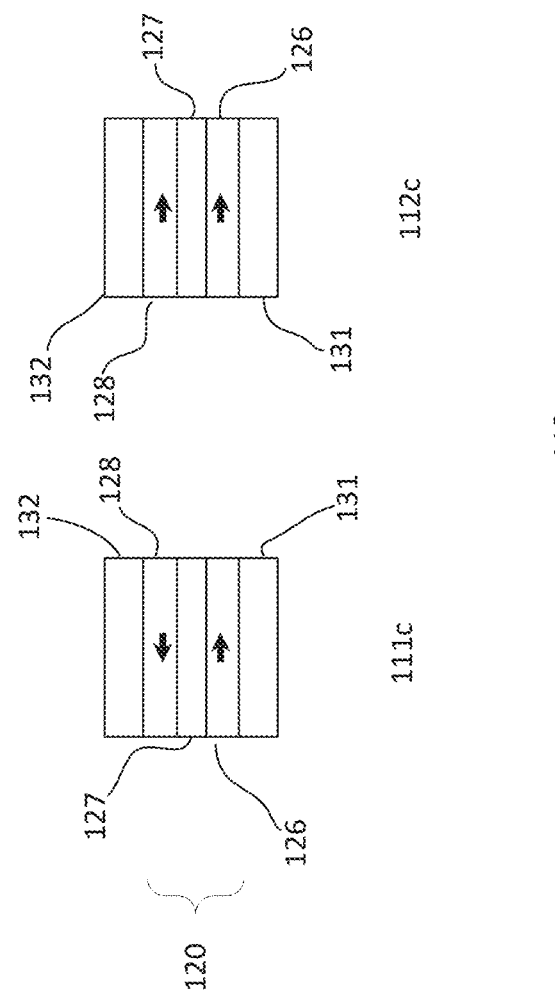

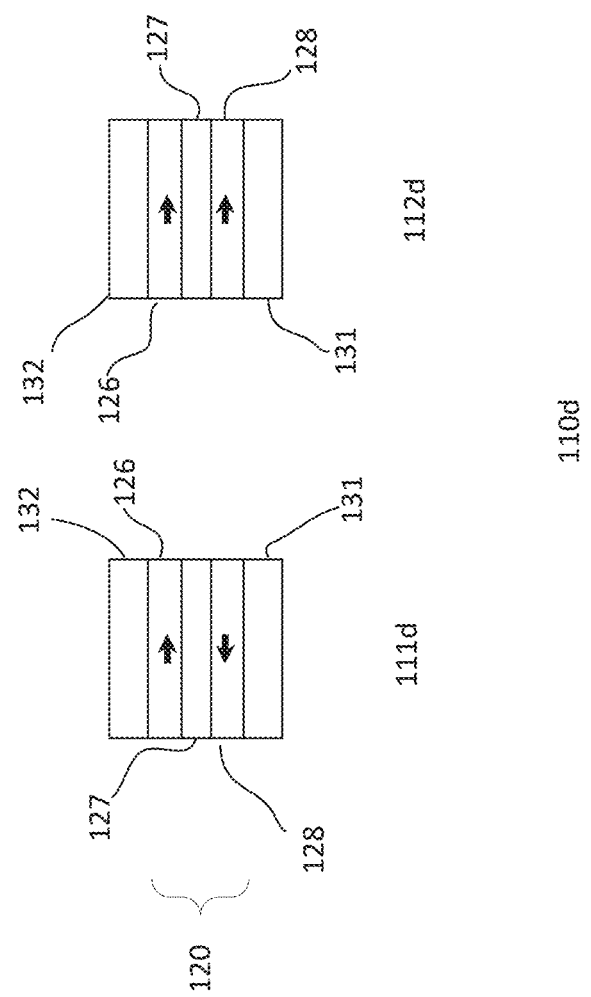

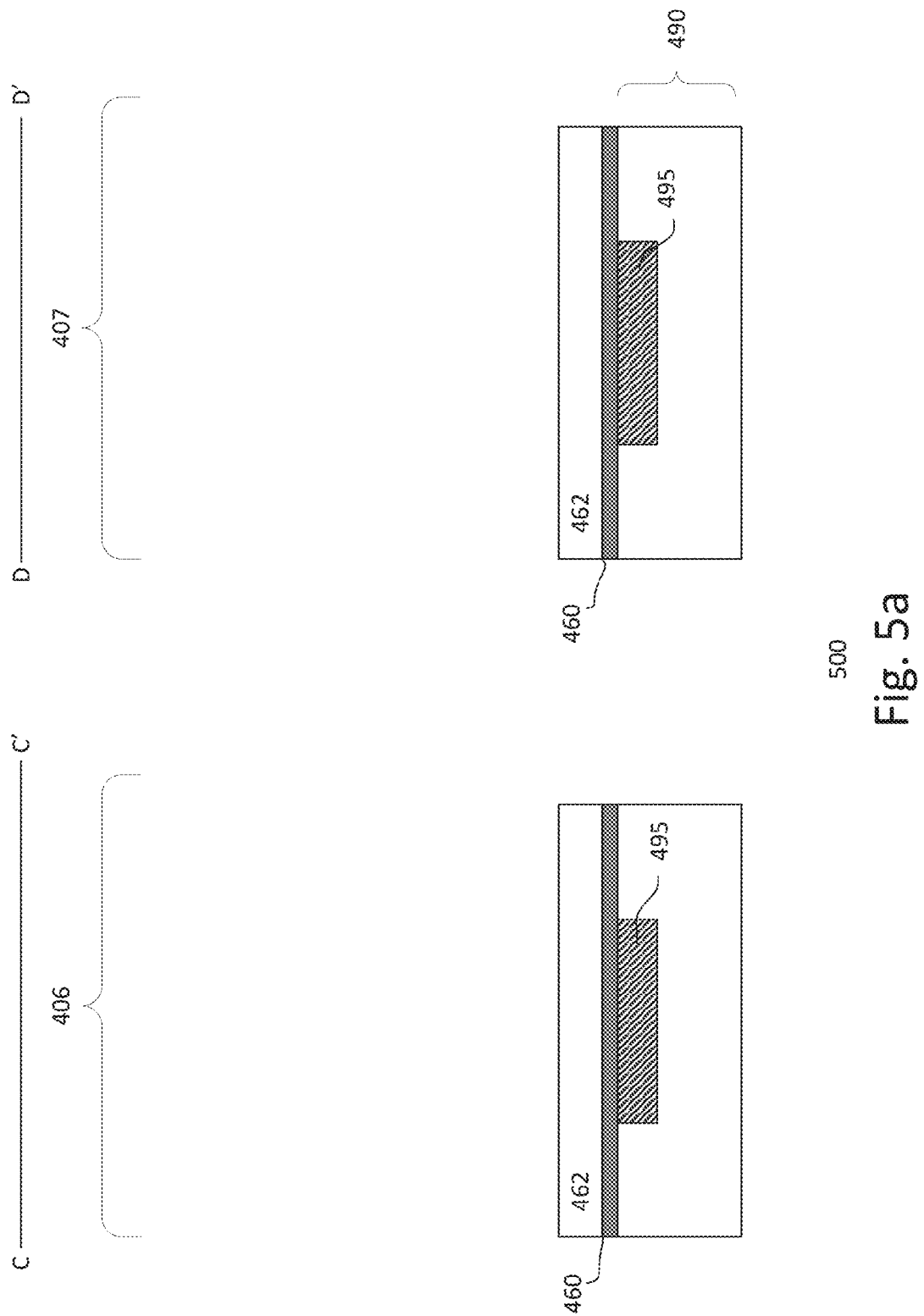

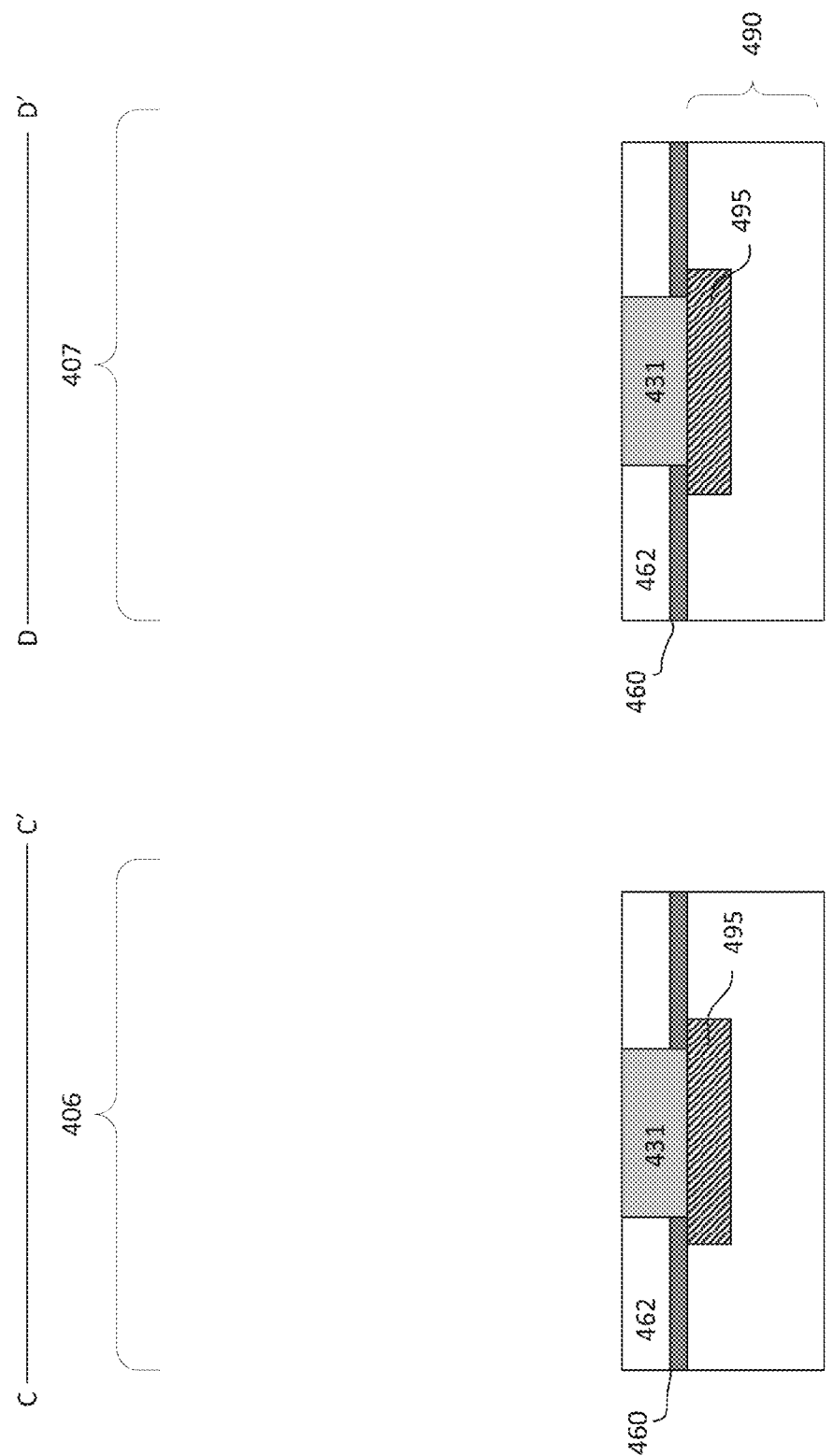

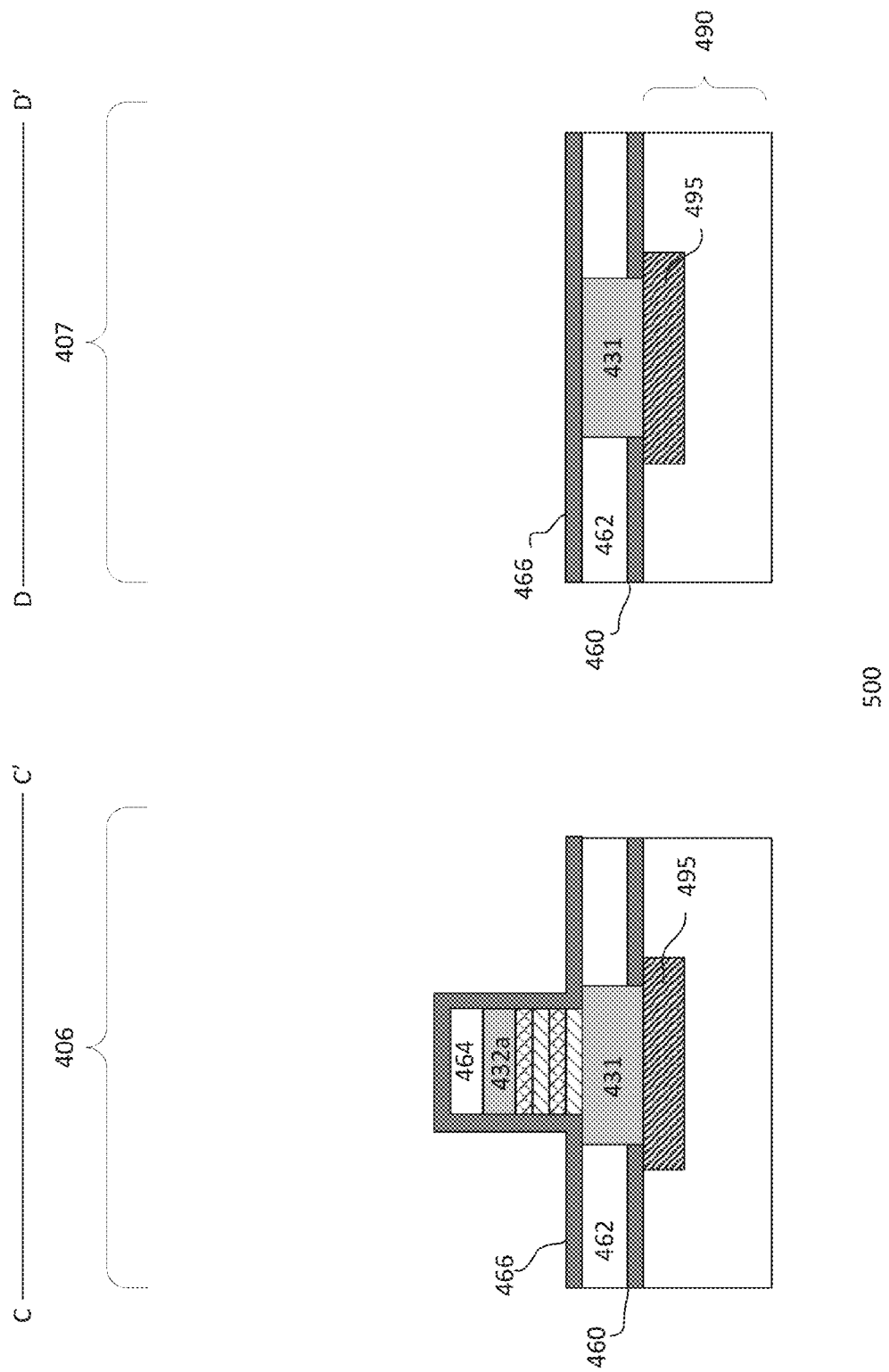

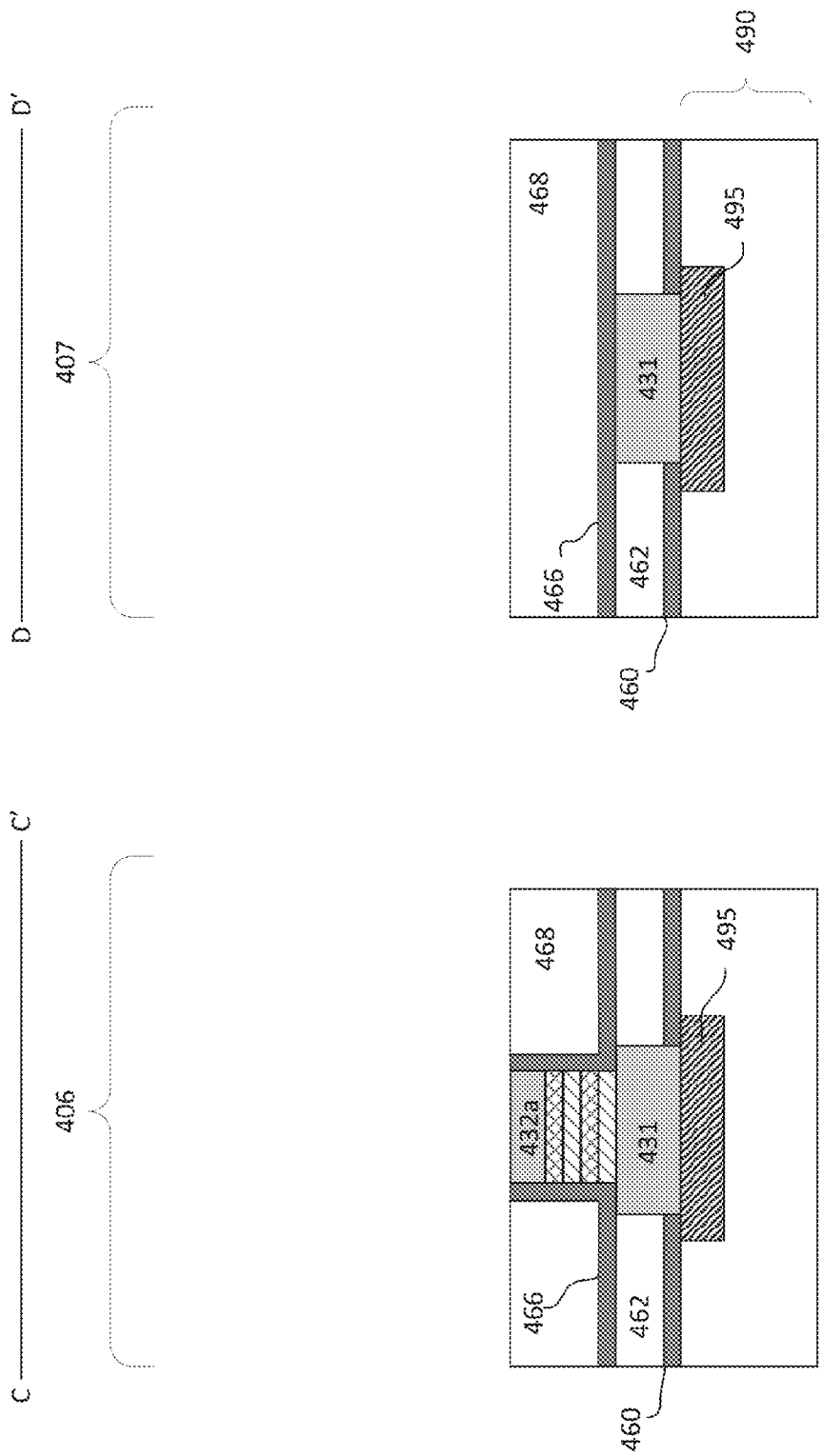

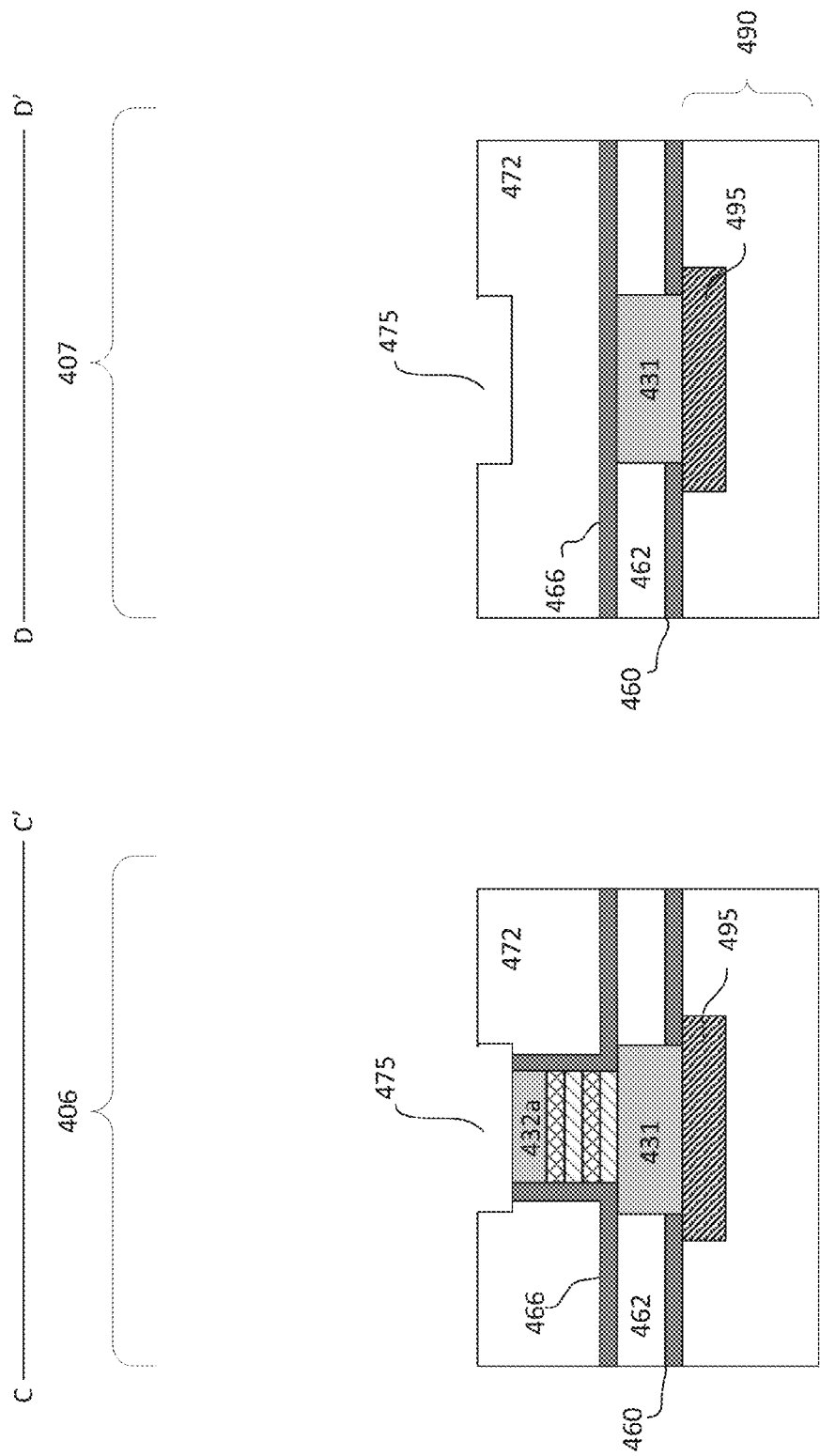

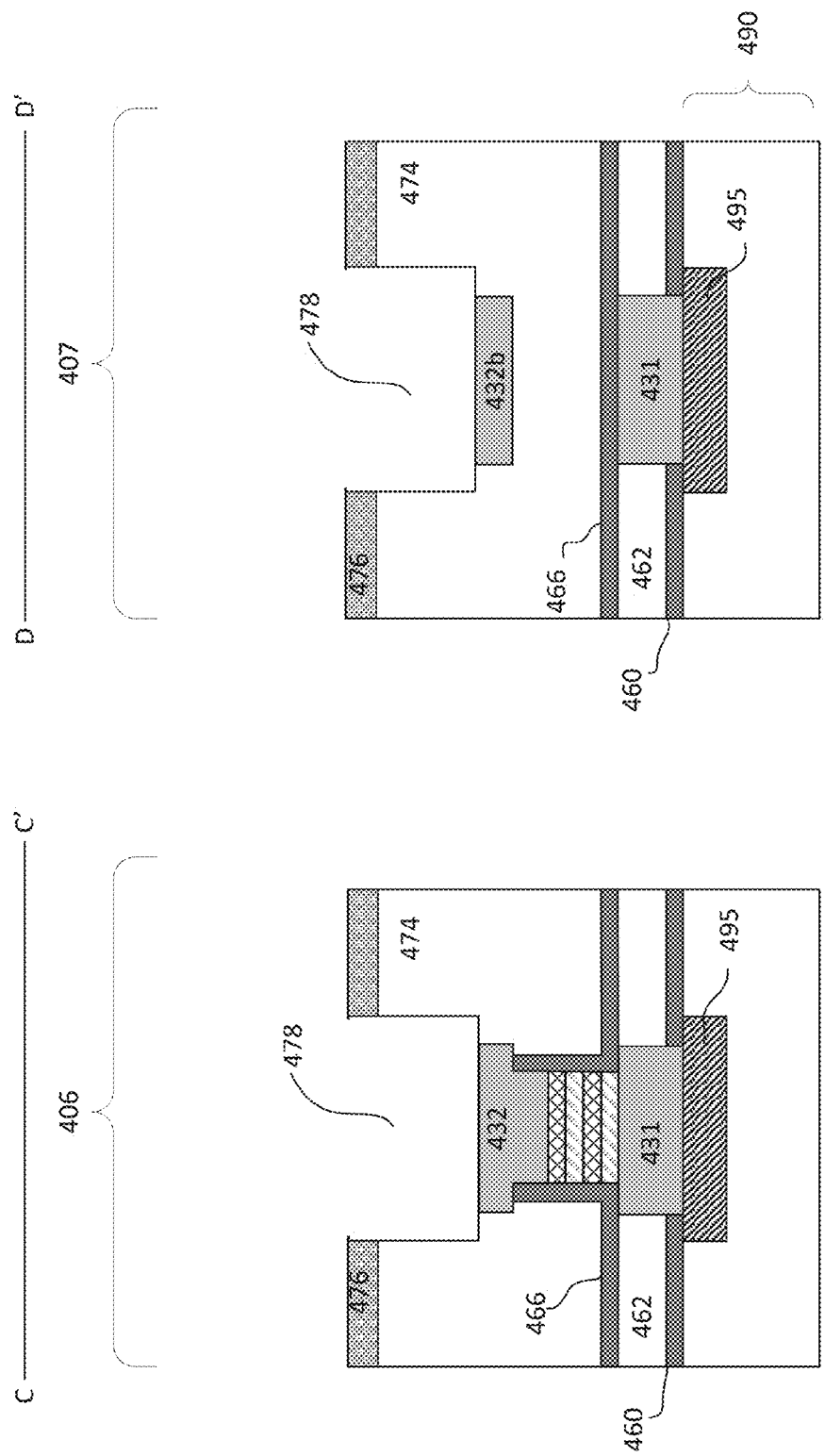

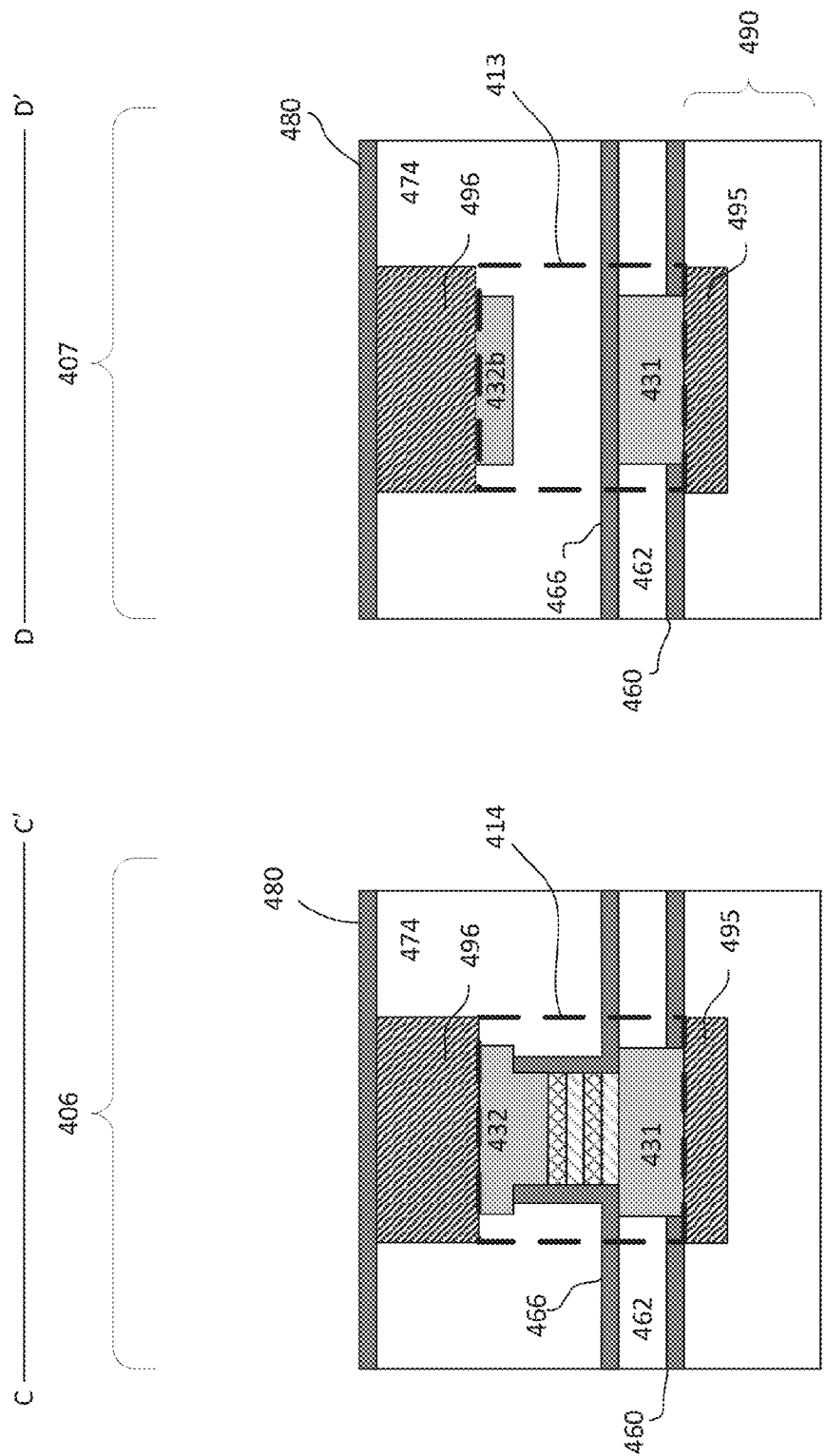

MAGNETISM-CONTROLLABLE DUMMY STRUCTURES IN MEMORY DEVICE

CROSS-REFERENCE TO RELATED APPLICATION

This application claims the priority benefit of U.S. Provisional Application Ser. No. 62/238,725, filed on Oct. 8, 2015, which is hereby incorporated by reference in its entirety for all purposes.

BACKGROUND

The use of magnetic random access memory (MRAM) that uses magnetic components, such as magnetic tunnel junction (MTJ) elements to store information has increased in recent years. MRAM typically stores data using magnetic-resistance effect, which is a departure from the conventional method of storing data using electrical charges such as static random access memory (SRAM) and dynamic random access memory (DRAM). Unlike SRAM and DRAM, MRAM is a non-volatile memory device that does not require constant electrical power to retain stored information. MRAM is particularly appealing in mobile device applications such as mobile phones and tablets because of less power consumption, higher speed, and higher density than conventional memory.

MRAM cells are commonly integrated with various logic components, such as logic transistors, inductor, capacitors, etc. in an embedded memory chip. However, electromagnetic interferences can be a problem for embedded memory chip or device. By Lorentz Force Law, MTJ elements can be affected by electric currents from the logic components; and logic components can be affected by magnetic fields from the MTJ elements. When embedded memory devices become smaller, more MTJ and logic components are placed in close proximity. These cause functional reliability issues for both MTJ and logic components in embedded MRAM devices.

Therefore, it is desirable to provide improved MRAM devices devoid of or with reduced electromagnetic interferences.

SUMMARY

Embodiments generally relate to magnetism-controllable dummy structures in embedded MRAM devices. In one embodiment, a method of forming a device is disclosed. The method includes providing a substrate defined with first and second functional regions and first and second non-functional regions. The first non-functional region corresponds to a proximate memory region which is proximate to and surrounds the first functional region and the second non-functional region corresponds to an external logic circuit region which surrounds at least the second functional region. A magnetic memory element is formed in the first functional region and a logic element is formed in the second functional region. A plurality of magnetism controllable dummy structures are formed in the proximate memory region and external logic circuit region. The magnetism controllable dummy structures provide uniform magnetic field to the magnetic memory element and prevents electrical-magnetic interaction between the magnetic memory and logic elements on the same substrate.

In another embodiment, a method of forming a device is presented. The method includes providing a substrate defined with first and second functional regions and first and second non-functional regions. The first non-functional region corresponds to a proximate memory region which is proximate to and surrounds the first functional region and the second non-functional region corresponds to an external logic circuit region which surrounds at least the second functional region. A first upper dielectric layer is provided over the first and second functional and non-functional regions of the substrate. The first upper dielectric layer includes a first upper interconnect level with a plurality of metal lines in the first and second functional and non-functional regions. A magnetic memory element is formed over the first upper dielectric layer in the first functional region and a logic element is formed over the first upper dielectric layer in the second functional region. A plurality of magnetism controllable dummy structures are formed over the first upper dielectric layer in the first and second non-functional regions. The magnetism controllable dummy structures provide uniform magnetic field to the magnetic memory element and prevents electrical-magnetic interaction between the magnetic memory and logic elements on the same substrate.

In yet another embodiment, a device is disclosed. The device includes a substrate defined with first and second functional regions and first and second non-functional regions. The first non-functional region corresponds to a proximate memory region which is proximate to and surrounds the first functional region and the second non-functional region corresponds to an external logic circuit region which surrounds at least the second functional region. A magnetic memory element is disposed in the first functional region and a logic element is disposed in the second functional region. The device also includes a plurality of magnetism controllable dummy structures disposed in the proximate memory region and external logic circuit region. The magnetism controllable dummy structures provide uniform magnetic field to the magnetic memory element and prevents electrical-magnetic interaction between the magnetic memory and logic elements on the same substrate.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-1d show simplified diagrams of MTJ units;

FIG. 4b shows cross-sectional view of various regions of the memory device of FIG. 4a;

FIG. 4c shows enlarged cross-sectional views of functional array region taken along A-A', functional logic region taken along B-B', first non-functional logic region taken along C-C' and second non-functional logic region taken along D-D' of the memory device of FIG. 4a; and FIGS. 5a-5l show cross-sectional views of an exemplary process for forming a memory device.

DETAILED DESCRIPTION

Figure 2:
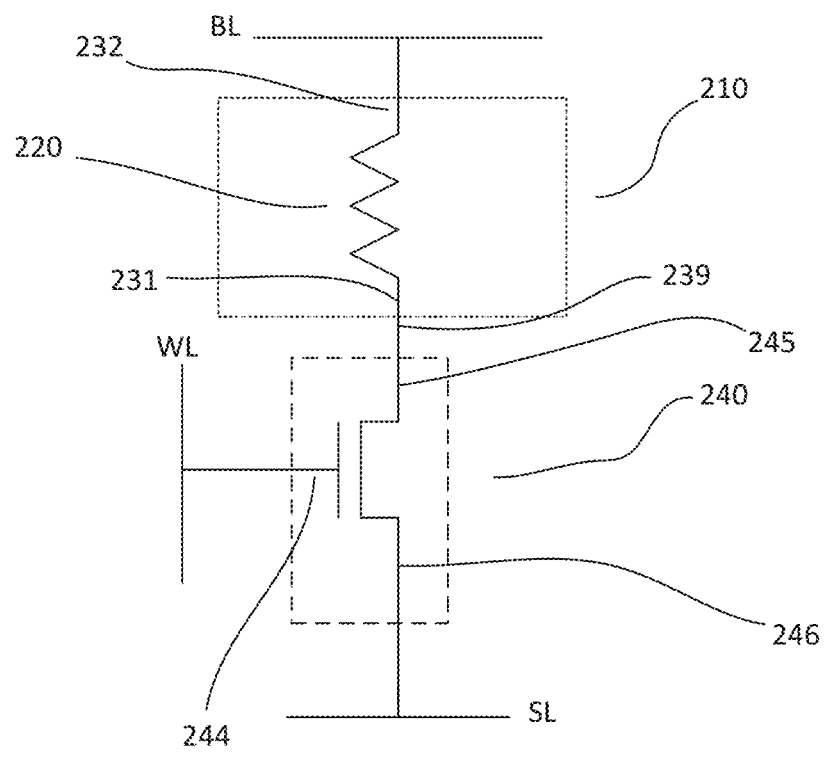
FIG. 2 shows a schematic diagram of an embodiment of a magnetic memory cell.

Embodiments of the present disclosure generally relate to integration of memory device with logic device in an integrated circuit (IC) or chip having magnetism controllable dummy structures. The memory device, for example, may include spin transfer torque magnetic random access memory (STT-MRAM) device. The memory device includes one or more memory cells having MTJ elements. Other suitable types of memory device may also be useful. Such memory device together with logic components are generally based on any suitable technology node (including but not limited to 28 nm technology node) where magnetism controllable dummy structures are employed. The magnetism controllable dummy structures include magnetic MTJ dummy structures disposed in a first non-functional logic region (or proximate memory region) surrounding functional array region and non-magnetic dummy structures disposed in a second non-functional logic region (or external logic circuit region) surrounding the functional logic region and the first non-functional logic region which will be described in detail later. Such memory devices, for example, may be incorporated into standalone memory devices including, but not limited to, Universal Serial Bus (USB) or other types of portable storage units, or integrated circuits (ICs), such as microcontrollers or system on chips (SoCs). The devices or ICs may be incorporated into or used with, for example, consumer electronic products, or relate to other types of devices.

FIG. 1a shows a simplified cross-sectional view of an embodiment of a MTJ unit 110a. The MTJ unit, for example, may be used as a storage unit of a magnetic memory cell. Other applications for the MTJ unit may also be useful. The MTJ unit includes a MTJ element or stack 120 disposed between first and second electrodes 131 and 132. The first electrode may be a bottom electrode while the second electrode may be a top electrode. The bottom electrode, for example, is proximate to the substrate on which the memory cell is formed while the top electrode is distal from the substrate.

The MTJ element includes a magnetically fixed layer 126, a tunneling barrier layer 127 and a magnetically free layer 128. As shown, the magnetic orientation of the magnetic layers is in a perpendicular direction. The perpendicular direction, for example, refers to the direction which is perpendicular to the surface of a substrate or perpendicular to the plane of the layers of the MTJ element. In one embodiment, the magnetically fixed layer is disposed below the magnetic free layer, forming a bottom pinned perpendicular MTJ (pMTJ) element. The perpendicular direction of the fixed layer is in a first perpendicular direction. The first perpendicular direction is shown to be in an upward direction away from the substrate. Providing the first perpendicular direction which is in a downward direction towards the substrate may also be useful. As for the magnetic orientation of the free layer, it may be programmed to be in a first or same (parallel) direction as the fixed layer or in a second or opposite (anti-parallel) direction as the fixed layer.

For example, the fixed layer is the layer with a magnetically hard or fixed orientation which does not switch unless a very high field is applied. The free layer or the storage layer is the layer whose magnetic orientation switches from one direction to the other by applying field or current. The field or current is less than that which makes the hard layer switch its magnetic orientation. As shown by structure 111a, the magnetic direction of the free layer is programmed to be in the second or anti-parallel direction to the fixed layer. The corresponding MTJ electrical resistance between the free layer 128 and the fixed layer 126 is denoted as $R_{AP}$. Structure 112a illustrates the magnetization of the free layer programmed to be in the first or parallel direction to the fixed layer. The corresponding MTJ electrical resistance between the free layer 128 and the fixed layer 126 is denoted as $R_P$. The resistance $R_{AP}$ is higher than the resistance $R_P$. For example, when the magnetization of free and fixed layers is parallel, they represent low resistance. Conversely, when the magnetization of the free and fixed layers is anti-parallel, they represent high resistance.

FIG. 1b shows a MTJ unit 110b, which is similar to the storage unit 110a of FIG. 1a. Common elements may not be described or described in detail.

The storage unit includes a pMTJ element 120 disposed between a bottom electrode 131 and a top electrode 132. The pMTJ element includes a magnetically fixed layer 126, a tunneling barrier layer 127 and a magnetically free layer 128. The fixed layer is disposed above the free layer, forming a top pinned pMTJ element. As shown by structure 111b, the magnetic direction of the free layer is programmed to be in the second or anti-parallel direction to the fixed layer. As for the structure 112b shown in FIG. 1b, the magnetic direction of the free layer is programmed to be in the first or parallel direction to the fixed layer.

FIG. 1c shows a MTJ unit 110c, which is similar to the MTJ unit 110a of FIG. 1a. Common elements may not be described or described in detail.

The MTJ unit includes a MTJ element 120 disposed between a bottom electrode 131 and a top electrode 132. The MTJ element includes a magnetically fixed layer 126, a tunneling barrier layer 127 and a magnetically free layer 128. As shown, the magnetization directions of the various layers are in the horizontal or in-plane direction. The term horizontal direction, for example, refers to the direction which is parallel or in plane with the surface of a substrate. In one embodiment, the fixed layer is disposed below the magnetic free layer, forming a bottom pinned in-plane MTJ (iMTJ) element. As for the magnetic orientation of the free layer, it may be programmed to be in a first or same horizontal direction as the fixed layer or in a second or opposite horizontal direction as the fixed layer.

For example, as shown by structure 111c, the magnetic direction of the free layer is programmed to be in the second or anti-parallel direction to the fixed layer. The corresponding MTJ electrical resistance between the free layer 128 and the fixed layer 126 is denoted as $R_{AP}$. Structure 112c illustrates that the magnetization of the free layer is programmed to be in the first or parallel direction to the fixed layer. The corresponding MTJ electrical resistance between the free layer 128 and the fixed layer 126 is denoted as $R_P$. The resistance $R_{AP}$ is higher than the resistance $R_P$.

FIG. 1d shows a MTJ storage unit 110d, which is similar to the storage unit 110c of FIG. 1c. Common elements may not be described or described in detail.

The storage unit includes an iMTJ element 120 disposed between a bottom electrode 131 and a top electrode 132. The iMTJ element includes a magnetically fixed layer 126, a tunneling barrier layer 127 and a magnetically free layer 128. The fixed layer is disposed above the free layer, forming a top pinned iMTJ element. As shown by structure 111d, the magnetic direction of the free layer is programmed to be in the second or anti-parallel direction to the fixed layer. As for the structure 112d shown in FIG. 1d, the magnetic direction of the free layer is programmed to be in the first or parallel direction to the fixed layer.

FIG. 2 shows a schematic diagram of an embodiment of a memory cell 200. The memory cell is a non-volatile memory cell used for storing information or data. For example, the memory cell may be a magnetoresistive memory cell. In one embodiment, the memory cell is a STT-MRAM cell. Other suitable types of memory cells may also be useful. The memory cell includes a magnetic storage unit 210 and a cell selector unit 240. The storage unit is coupled to the cell selector unit. For example, the storage unit and cell selector unit are coupled at a first cell node 239 of the memory cell. The storage unit 210, in one embodiment, is a magnetic storage unit and includes a MTJ element 220. The MTJ element may be a bottom pinned pMTJ element, a top pinned pMTJ element, a bottom pinned iMTJ element or a top pinned iMTJ element, as described in FIGS. 1a-1d. Other suitable types of MTJ elements may also be useful.

The MTJ element includes first and second electrodes 231 and 232. The first electrode, for example, may be a bottom electrode while the second electrode may be a top electrode. Other configurations of electrodes may also be useful. In one embodiment, the top electrode of the storage unit is electrically connected to a bitline (BL). The bottom electrode of the storage element is connected to the first cell node 239.

The cell selector unit includes a selector for selecting the memory cell. The selector, for example, may be a select transistor. In one embodiment, the select transistor is a metal oxide semiconductor (MOS) transistor. In one embodiment the selector is a n-type MOS transistor. The select transistor includes first and second source/drain (S/D) terminals 245 and 246 and a gate or control terminal 244. The first S/D terminal may be referred to as a drain and the second S/D terminal may be referred to as the source. The S/D terminals, for example, are heavily doped regions with first polarity type dopants, defining the first polarity type transistor. For example, in the case of a n-type transistor, the S/D terminals are n-type heavily doped regions. Other types of transistors or selectors may also be useful.

In one embodiment, the first terminal of the cell selector and first electrode of the storage unit are commonly coupled at the first cell node. For example, the first S/D terminal of the cell selector is coupled to the bottom electrode of the storage unit. For example, the drain terminal is coupled to the storage unit. The second or source terminal of the cell selector is coupled to a source line (SL). As for the gate terminal, it is coupled to a wordline (WL).

Figure 3:
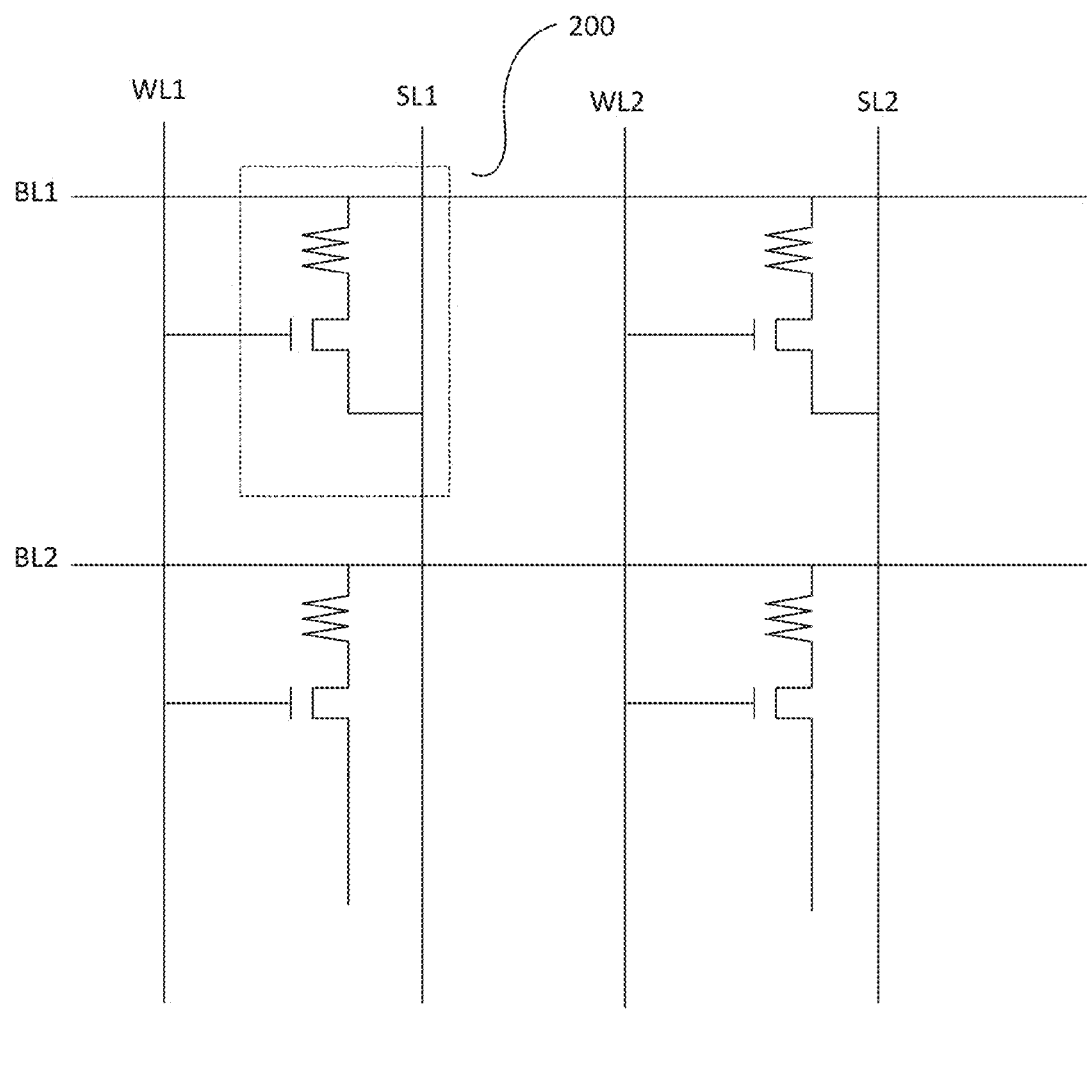
FIG. 3 shows an array of magnetic memory cells.

FIG. 3 shows a schematic diagram of an embodiment of a memory array 300. The array includes a plurality of memory cells 200 interconnected. The memory cells may be similar to those described in FIG. 2. For example, the memory cells are MRAM cells, such as STT-MRAM cells. Common elements may not be described or described in detail. Other suitable types of memory cells may also be useful.

As shown, the array includes four memory cells arranged in a 2×2 array. For example, the array is arranged to form two rows and two columns of memory cells. Memory cells of a row are interconnected by a wordline (WL1 or WL2) while memory cells of a column are interconnected by a bitline (BL1 or BL2). A second S/D or source terminal is coupled to a source line (SL1 or SL2). As shown, the SLs are in the row or wordline direction. Other suitable cell configurations may also be useful. Although the array is illustrated as a 2×2 array, it is understood that arrays of other sizes may also be useful.

Figure 4A:
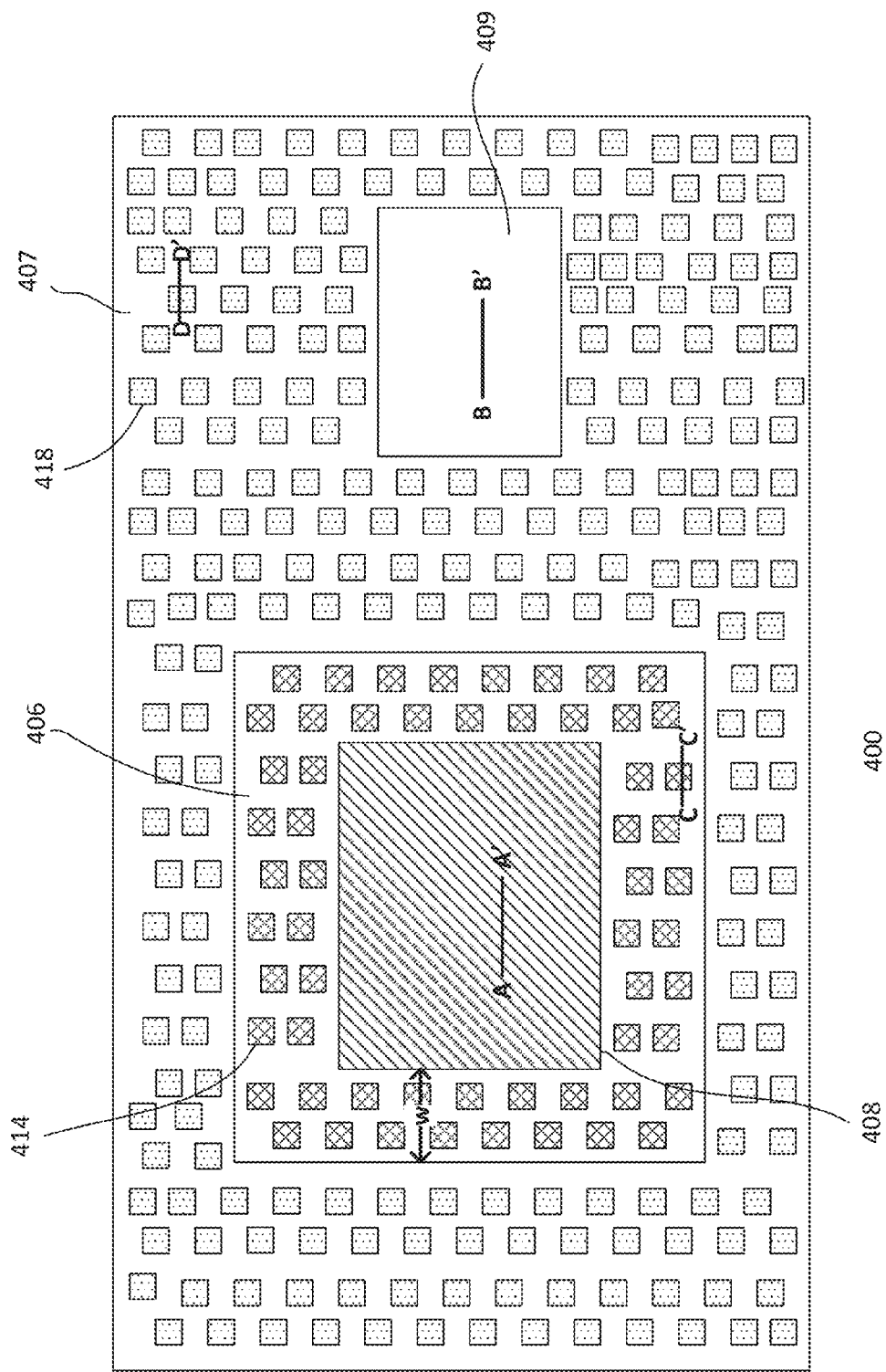
FIG. 4a shows a top view of an embodiment of a memory device having memory components in a functional array region, logic components in a functional logic region, magnetic dummy structures in a first non-functional logic region (or proximate memory region) and non-magnetic dummy structures in a second non-functional logic region (or external logic circuit region)
Figure 4B:
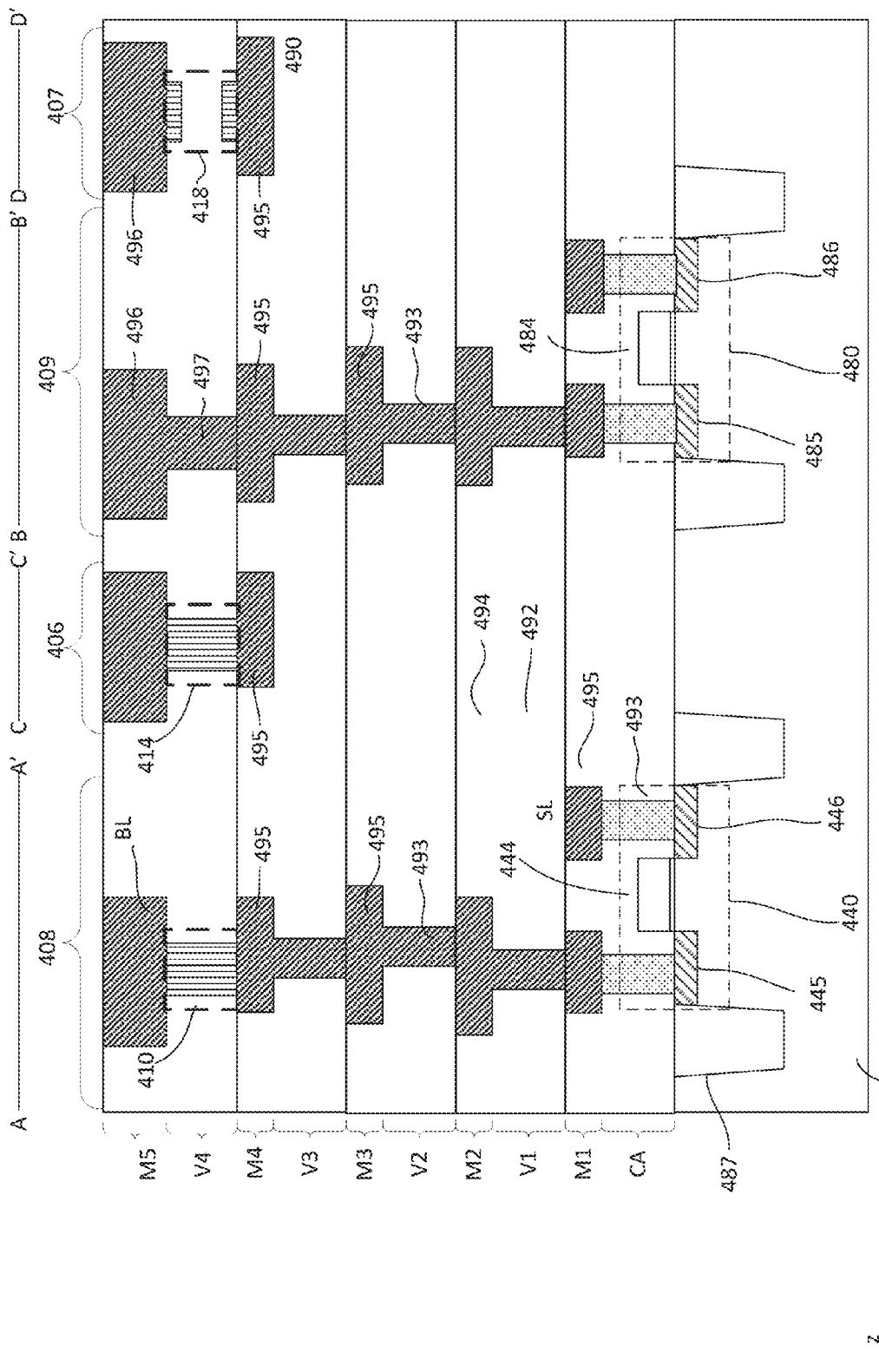
Figure 4C:
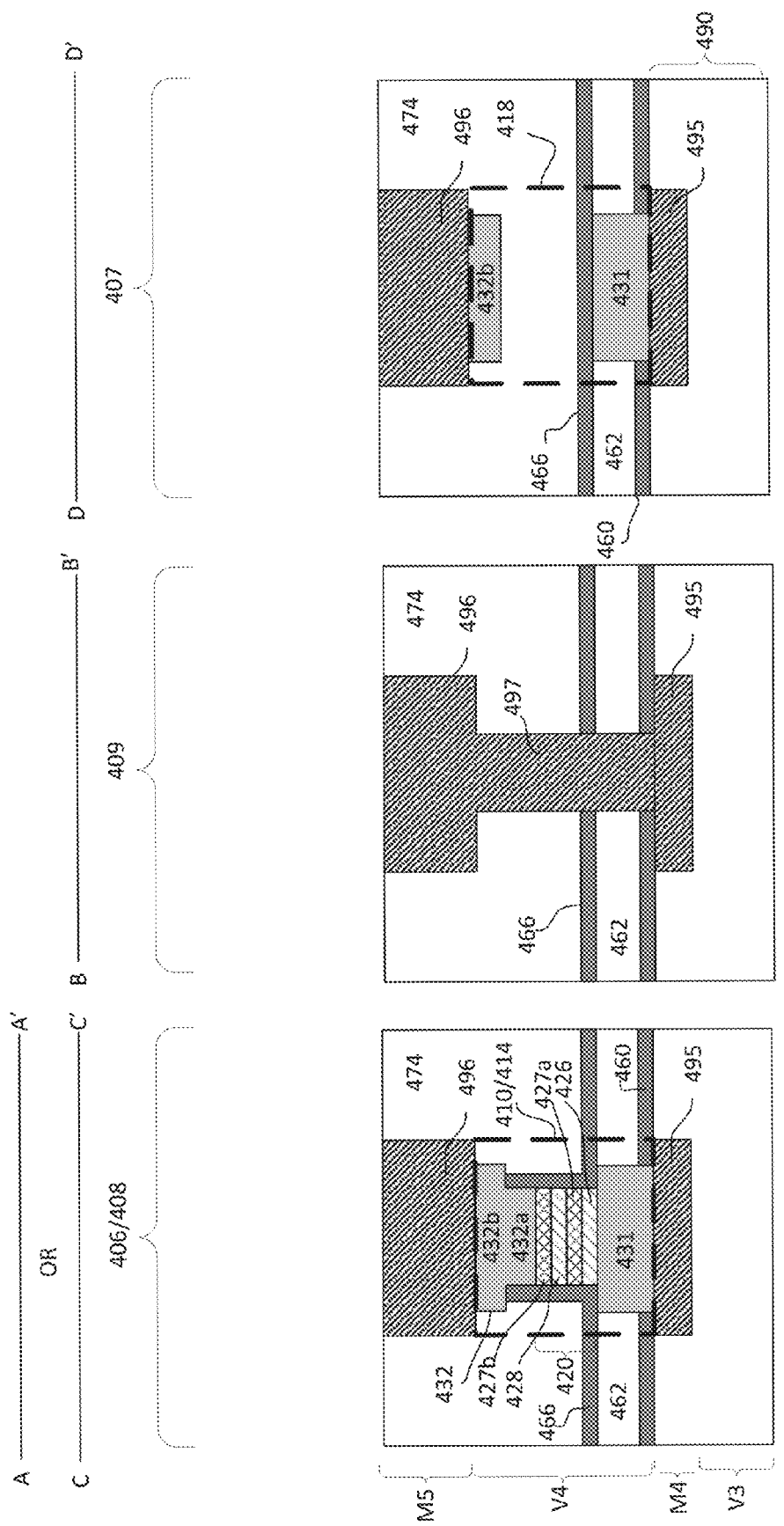

FIG. 4a shows a top view of an embodiment of a memory device 400, FIG. 4b shows cross-sectional view of the various regions of the memory device 400 while FIG. 4c shows enlarged cross-sectional views of upper ILD level of the various regions of the device 400.

Referring to FIG. 4a, the top view of the memory device illustrates a first functional region (or functional memory or array region) 408 having one or more memory components, a second functional region (or functional logic region) 409 having one or more logic components, a first non-functional logic region 406 having first type dummy structures (magnetic MTJ dummy structures) 414 surrounding or proximate to the array region 408 and a second non-functional logic region 407 having second type dummy structures (non-magnetic dummy structures) 418 surrounding the functional logic region 409 and first non-functional logic region 406. The first non-functional logic region 406 may be referred to as proximate memory region and the second non-functional logic region 407 may also be referred to as external logic circuit region. The proximate memory region 406 having the magnetic MTJ dummy structures 414 occupies an area having a width (w) of about 20-150 μm with reference to the outermost edges of the array region 408. Other suitable width dimensions may also be useful, depending on magnetic field, process uniformity requirement and MRAM design requirement of certain technology node.

FIG. 4b shows cross-sectional views of functional array region 408 taken along A-A', functional logic region 409 taken along B-B', proximate memory region 406 taken along C-C', and external logic circuit region 407 taken along D-D'. The cross-sectional views, for example, are taken along a bitline (or x) direction of the device. The device 400, in one embodiment, includes a memory cell having a cell selector unit or transistor 440 disposed in the first functional region 408, a logic transistor 480 disposed in the second functional region 409, a first type dummy structure 414 disposed in the proximate memory region 406 and a second type dummy structure 418 disposed in the external logic circuit region 407. The memory cell, for example, may be a NVM memory cell. The memory cell, in one embodiment, is a magnetoresistive NVM cell, such as a STT-MRAM cell.

The cell select unit 440 of the memory cell and the logic transistor 480 of the logic component are disposed on a substrate 405. For example, the memory cell selector unit is disposed in a memory cell region while the logic transistor is disposed in a logic region of the same substrate. The memory cell region is part of the first functional (or functional array) region 408 while the logic region is part of the second functional (or functional logic) region 409. For example, the functional array region may include a plurality of memory cell regions having a plurality of memory cells while the functional logic region may include a plurality of logic transistors. The substrate may also include other types of device regions (not shown).

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front end of line (FEOL) processing is performed on the substrate. The FEOL process, for example, forms n-type and p-type devices or transistors in the memory cell region, the logic region as well as other regions on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

As shown, the FEOL processing forms at least a memory cell region and a logic region isolated by isolation regions 487, such as shallow trench isolation (STI) regions. The memory cell region is for a memory cell. Isolation regions may be provided to isolate columns of memory cells. Other configurations of isolation regions may also be useful. The first functional region 408 may include a cell device well (not shown) while the second functional region 409 may include a logic device well (not shown). The cell device well, for example, serves as a body well for a cell select transistor 440 of the memory cell while the logic device well, for example, serves as a body well for the logic transistor 480. The device wells may be doped with second polarity type dopants for first polarity type transistors. The device wells may be lightly or intermediately doped with second polarity type dopants. In some cases, a device isolation well (not shown) may be provided, encompassing the device well. The isolation well may have a dopant type which has the opposite polarity to that of the device well. For example, the isolation well may include first polarity type dopants. The isolation well serves to isolate the device well from the substrate. Well biases may be provided to bias the wells.

As shown, the first functional region 408 includes a cell selector unit 440 while the second functional region 409 includes a logic transistor 480. The cell selector unit includes a selector for selecting the memory cell. The selector, for example, may be a select transistor. In one embodiment, the select and logic transistors are metal oxide semiconductor (MOS) transistors. Thus, the FEOL processing forms the select transistor in region 408 and the logic transistor in region 409. The select transistor 440, as shown, includes first and second source/drain (S/D) regions 445 and 446 formed in the substrate and a gate 444 disposed on the substrate between the S/D regions. As for the logic transistor 480, it includes first and second S/D regions 485 and 486 formed in the substrate and a gate 484 disposed on the same substrate between the S/D regions. The S/D regions, for example, are heavily doped regions with first polarity type dopants, defining the first polarity type transistor. For example, in the case of a n-type transistor, the S/D regions are n-type heavily doped regions. Other types of transistors or selectors may also be useful. As for the gate, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a wordline (or y) direction. The gate conductor forms a common gate for a row of cells.

A S/D region may include LDD and halo regions (not shown). Dielectric spacers (not shown) may be provided on the gate sidewalls of the transistor to facilitate forming transistor halo, LDD and transistor S/D regions. It is understood that not all transistors include LDD and/or halo regions.

After forming the select transistor in the first functional region and the logic transistor in the second functional region and other transistors (not shown) in other device regions, back end of line (BEOL) processing is performed. The BEOL process includes forming interconnects in inter-level dielectric (ILD) layers. The interconnects connect the various components of the IC to perform the desired functions. An ILD level includes a metal level 494 and a contact level 492. Generally, the metal level includes conductors or metal lines while the contact level includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 5 ILD levels (x=5). Other suitable number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric (PMD) layer or first contact layer of the BEOL process. The dielectric layer may be referred to as CA level of the BEOL process. Contacts 493 are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical polishing (CMP), is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The first ILD layer, for example, is formed of a low-k dielectric material. Preferably, the first ILD layer is an ultra low-k dielectric layer, such as SiCOH. Other suitable types of low-k dielectric materials may also be useful. The dielectric layer may be formed by CVD. Other suitable techniques for forming the first ILD layer may also be useful.

Conductive or metal lines 495 are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 level dielectric layer. The first metal level M1 and CA may be referred as a lower ILD level.

The process continues to form additional or upper ILD layers/levels. The additional ILD levels may include ILD level 2 to ILD level x. For example, in the case where x=5 (5 levels), the upper ILD level includes ILD levels from 2 to 5, which includes metal levels M2 to M5 and via levels V1 to V4. Designating other ILD levels as upper ILD level may also be useful. The number of ILD levels may depend on, for example, design requirements or the logic process involved. The ILD layers, in one embodiment, are formed of low-k dielectric materials. Preferably, the ILD layers of ILD levels 2 to 5 include ultra low-k dielectric layers, such as SiCOH. Other suitable types of low-k dielectric materials may also be useful. The ILD layers may be formed by, for example, CVD. Other techniques for forming the ILD layers may also be useful.

The conductive lines 495 and contacts 493 in the additional ILD layers (e.g., ILD levels 2 to 4) may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M5) may have different design rules, such as critical dimension (CD), than the lower ILD levels. For example, Mx may have a larger CD than metal levels M1 to Mx−1 below. For example, the uppermost metal level may have a CD which is 2× the CD of the metal levels below.

As shown, S/D contacts are disposed in the CA level. The S/D contacts are coupled to the first and second S/D regions of the transistors in the first and second functional regions. Other S/D contacts coupled to other S/D regions of transistors may also be provided. The CA level may include a gate contact (not shown) coupled to the gate of the transistor. The gate contact may be disposed in another cross-section of the device. For example, the gate contact (not shown) couples the gate 444 of the select transistor to a wordline (WL) which may be provided by the gate or provided in any suitable metal level. The contacts may be tungsten contacts. Other types of contacts may also be useful. Other S/D and gate contacts for other transistors may also be provided.

As described, metal lines are provided in M1. The metal lines are coupled to the S/D contacts. As an example, a source line (SL) is coupled to the second S/D region 446 of the select transistor in the first functional region. As for the first S/D region (e.g., 445 or 485), it may be coupled to a contact pad or island in M1 by a S/D contact 493. The contact pad in M1 provides connections to upper ILD levels. The metal lines or pads may be formed of copper or copper alloy. Other types of conductive material may also be useful.

As for the additional or upper ILD levels, for example, from 2 to 5, they include contacts (e.g., 493 or 497) in the via level 492 and contact pads/metal lines (e.g., 495 or 496) in the metal level 494. The contacts and contact pads provide connection from M5 to the first S/D region of the transistors in the first and second functional regions 408 and 409.

As shown in FIG. 4b, the first functional region 408 accommodates a MRAM cell, the second functional region 409 accommodates a logic component, the proximate memory region 406 accommodates a first type dummy structure 414 and the external logic circuit region 407 accommodates a second type dummy structure 418. In one embodiment, the device includes a MRAM cell having a storage or memory element 410 disposed in the first functional region 408 and first and second type dummy structures 414 and 418 disposed in the proximate memory region 406 and external logic circuit region 407. The storage element and dummy structures are generally disposed in between adjacent final metal levels of upper ILD level of the device. In one example, the storage element 410 and the first and second type dummy structures 414 and 418 are formed in between adjacent upper ILD levels, such as upper ILD level 4 to 5. It is understood that the storage element of the MRAM cell and the dummy structures may be disposed in between any suitable adjacent ILD levels. For illustration purpose, FIG. 4c shows the enlarged cross-sectional views of the different structures or elements disposed in between the adjacent final metal levels of upper ILD level of the device of FIG. 4b. In one embodiment, the storage element 410 of the MRAM cell and the first type dummy structure (magnetic dummy structure) 414 include the same structure and therefore shares the same enlarged cross-sectional view in FIG. 4c.

Referring to FIG. 4c, a dielectric layer 490 which corresponds to the upper ILD level 4 is shown. The upper ILD level 4, for example, includes a via level and a metal level. For example, the upper ILD level 4 includes via level V3 and metal level M4. One or more via contacts (not shown) may be disposed in V3 in the first and second functional regions 408 and 409 while no via contacts are formed in the proximate memory region 406 and external logic circuit region 407.

For the sake of simplicity, the dielectric layer 490 in this disclosure may be referred to as a first upper dielectric layer and its via and metal levels may be referred to as a first upper interconnect level. As shown in the first and second functional regions and non-functional regions, metal lines 495 are disposed in the metal level (e.g., M4) of the first upper dielectric layer 490. The metal line 495, for example, may be referred to as a lower interconnect of the upper ILD levels in the first and second functional and non-functional regions. In one embodiment, the metal line 495 in the first functional region 408 is coupled to a storage element 410 of the MRAM cell which will be described later while the metal line in the second functional region 409 may be coupled to an upper interconnect. The metal line 495 in the first functional region, for example, may be used for electrical connection purpose and couples the storage element to first S/D region of the select transistor while the metal line 495 in the second functional region, for example, may be used for electrical connection purpose and couples the upper interconnect to the first S/D region of the logic transistor. On the other hand, the metal lines 495 in the regions 406 and 407 are not coupled to any electrical circuit and are not used for electrical connection. Although one metal line is shown in each of the regions, it is understood that there could be other suitable number of metal lines in the same metal level of the regions 406, 407, 408 and 409.

The metal lines 495 include a conductive material. The conductive material, for example, includes copper (Cu). Other suitable types of conductive material may also be useful. The dimensions of this metal line 495 and its underlying via contact (not shown) in the first and second functional regions, for example, are defined at the minimum line resolution of the lithography and etch capability for a technology process node, which may be referred to as 1× design rule. The thickness of the metal lines 495 with reference to the top surface of the first upper dielectric layer 495, for example, is about 850-1000 Å. Other suitable thickness dimensions may also be useful, depending on the design requirements of a technology node.

A dielectric liner 460 is disposed above the first upper dielectric layer 490 in the regions 406, 407, 408 and 409 and covering the metal lines 495. The dielectric liner, for example, serves as an etch stop layer. The dielectric liner may be a low k dielectric liner. For example, the dielectric liner may be nBLOK. Other suitable types of dielectric materials for the dielectric liner may also be useful.

A second upper dielectric layer 462 is disposed on the first upper dielectric layer 490. For example, the second upper dielectric layer is disposed on the dielectric liner 460. The second upper dielectric layer, in one embodiment, includes a low-k dielectric material, such as SiCOH. Other suitable dielectric materials and thicknesses for the second upper dielectric layer may also be useful.

The second upper dielectric layer 462, in one embodiment, includes trenches in the first functional region 408, proximate memory region 406 and external logic circuit region 407. The trench in the first functional region 408, for example, accommodates a bottom electrode of a storage element of the MRAM cell while the trenches in the regions 406 and 407 accommodate a bottom electrode of a dummy structure. The trenches, for example, extend from the top surface of the second upper dielectric layer to the top surface of the metal lines.

As described, the storage element 410 of the MRAM cell and the first type dummy structure (magnetic dummy structure) 414, in one embodiment, include the same structure and therefore shares the same enlarged cross-sectional view in FIG. 4c. In the regions 406 and 408, a magnetic tunnel junction (MTJ) element is formed over the first upper dielectric layer. The MTJ element in the first functional region 408 is used to store data while the MTJ element in the proximate memory region 406 serves as a magnetic dummy fill of the first type dummy structure 414. A MTJ element includes first and second electrodes. The first electrode, for example, may be a bottom electrode 431 while the second electrode may be a top electrode 432. In one embodiment, the top electrode includes a lower top electrode portion 432a and an upper top electrode portion 432b. Other configurations of electrodes may also be useful. The bottom electrode 431 of the MTJ element is disposed in the trench of the second upper dielectric layer and is connected to the metal line 495. The bottom electrode 463, in one embodiment, extends through the second upper dielectric layer and dielectric liner and is directly coupled to the metal line 495 in the regions 406/408.

A MTJ element also includes a MTJ stack 420 disposed in between the top and bottom electrodes. The MTJ element, for example, may be configured as a bottom-pinned MTJ element or a top-pinned MTJ element as described in FIGS. 1a-1d. The bottom-pinned MTJ element is formed by having the magnetically fixed layer disposed below the magnetically free layer while the top pinned MTJ element is formed by having the fixed layer disposed above the free layer. For illustration purpose, the MTJ stack includes four layers. It is understood that the MTJ stack may include other suitable number of layers. The MTJ stack generally includes a magnetically fixed (pinned) layer 426, one or more tunneling barrier layers 427a and 427b and a magnetically free layer 428. The fixed layer includes a magnetic layer and a pinning layer. The pinning layer, for example, pins the magnetization direction of the magnetic layer, forming a pinned layer.

By way of example, the free layer and the fixed layer may be CoFeB or CoFe based composite material and the tunneling barrier layer may be MgO or $Al_2O_3$. As for the pinning layer, it may be PtMn or IrMn. The top and bottom electrodes may be Ti, TiN, Ta, TaN or other suitable metals used in the semiconductor process. Other suitable configurations or materials of MTJ element may also be useful.

In the external logic circuit region 407, a second type dummy structure (non-magnetic dummy structure) 418 is formed over the first upper dielectric layer. The second type dummy structure in region 407 differs from the first type dummy structure 414 in region 406 in that the second type dummy structure 418 includes a bottom electrode and a top electrode with a dielectric material of a dielectric layer disposed in between the top and bottom electrodes which serve as a non-magnetic dummy fill of the dummy structure 418. In one embodiment, the bottom electrode 431 and top electrode 432b in region 407 are disposed at the same level as the bottom electrode and upper top electrode portion in regions 406 and 408.

In one embodiment, an encapsulation liner 466 may line exposed top surface of the second upper dielectric layer 462 in the regions 406, 407, 408 and 409. The encapsulation liner, as shown, also lines exposed surfaces of the bottom electrode 431, side surfaces of the MTJ stack 420 and side surfaces of the lower top electrode portion 432a in the regions 406 and 408, as shown in FIG. 4c. The encapsulation liner may be a low k dielectric liner. For example, the dielectric liner may be nBLOK. Other suitable types of dielectric materials for the encapsulation liner may also be useful.

A dielectric layer 474 is disposed over the second upper dielectric layer 462. The dielectric layer 474, for example, covers the MTJ elements in the regions 406 and 408. The dielectric layer 474 and the second upper dielectric layer 462, for example, corresponds to upper ILD level 5. The dielectric layer, for example, is a dielectric stack having one or more dielectric layers. For instance, the dielectric layer 474 may include third, fourth and fifth or other suitable number of upper dielectric layers. The dielectric layer 474 includes low-k dielectric material, such as SiCOH. Other suitable configurations and materials for the dielectric layer may also be useful.

The dielectric layer 474 includes a dual damascene interconnect structure in the second functional region 409 and a damascene interconnect structure in the first functional region 408, proximate memory region 406 and external logic circuit region 407. For example, the dielectric layer 474 includes a via contact 497 which couples a metal line 496 or upper interconnect to the lower interconnect 495 in the region 409 while the dielectric layer 474 accommodates the MTJ element and includes a metal line 496 coupled to the MTJ element of the memory cell and first type dummy structure in regions 406 and 408. The metal lines 496 are disposed in the metal level while the via contact and MTJ elements are disposed in the via level of the dielectric layer 474. For simplicity, the via and metal levels of the dielectric layer 474 may be referred to as a second upper interconnect level. For example, the metal lines 496 may be disposed in metal level M5 while the via contact 497 and the MTJ elements may be disposed in via level V4. Although one metal line is shown for each of the regions in metal level M5, it is understood that there could be other suitable number of metal lines in the same metal level of the regions. In one embodiment, the metal line 496 in the first functional region 408 may be configured to serve as a bitline (BL) and the metal line 495 in the first functional region couples the bottom electrode of the MTJ element to the first S/D region of the select transistor. The metal lines 495 and 496 in the proximate memory region 406 differ from the metal lines 495 and 496 in the first functional region 408 in that any one of the metal lines 495 and 496 in the region 406 is floated or not electrically connected to any electrical circuit.

The via contact 497, for example, may be referred to as the top via contact and the metal lines 496, for example, may be referred to as the top metal line. The dimensions of the metal lines 496 and the via contact 497, for example, are defined at twice the minimum line resolution of the lithography and etch capability for a technology process node, which may be referred to as 2× design rule. For example, the thickness of the top metal lines 496, for example, may be at least 2 times greater than the thickness of the metal lines 495 below. The top via contact 497, as shown in FIG. 4c, couples the metal line 496 in upper metal level to the metal line 495 in lower metal level. The top via contact 497, for example, extends through the second upper dielectric layer 462 and dielectric liner 466. The top metal lines 496 include a thickness of, for example, about 2150 Å while the top via contact 497, for example, includes a height or thickness of about 1800 Å along the z direction based on 28 nm technology node as shown in FIG. 4c. Other suitable thickness dimensions may also be useful, depending on the design requirements of a technology node. The top via contact and top metal line include a conductive material, such as Cu. Other suitable configurations and conductive materials for the via contact and metal lines may also be useful.

A pad level (not shown) is disposed over the uppermost ILD level. For example, a pad dielectric level is disposed over Mx. In the case where the device includes 5 metal levels, the pad level is disposed over M5. The pad dielectric layer, for example, may be silicon oxide. Other types of dielectric materials may also be useful. The pad dielectric layer includes pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

As described and shown, the first type dummy structures (magnetic dummy structure) 414, the second type dummy structures (non-magnetic dummy structures) 418, the storage element of the memory cell and the dual damascene upper interconnect structure of logic component are disposed in the same ILD level. The magnetic dummy structures and the non-magnetic dummy structures having first and second electrodes are floated (i.e. not connected to circuits in the device).

FIGS. 5a-5l show simplified cross-sectional views of a process 500 for forming an embodiment of a device. In one embodiment, the process 500 allows first and second type dummy structures to be concurrently formed with memory and logic components on the same substrate using logic processing. The process 500 is based on any suitable technology node (including but not limited to 28-40 nm technology node). For simplicity, the cross-sectional views of the process 500 are taken along the first non-functional region (or proximate memory region) 406 and second non-functional region (or external logic circuit region) 407 of the device while cross-sectional views of the first and second functional regions 408 and 409 of the device are omitted or not shown. In FIGS. 5a-5l, the steps for forming the magnetic dummy structures in region 406 and non-magnetic dummy structures in region 407 are described and shown while common elements for forming the memory and logic BEOL components in regions 408 and 409 are not shown or described in detail. The device formed by process 500, for example, is similar or the same as that shown and described in FIGS. 4a-4c. As such, common elements and features having the same reference numerals may not be described or described in detail.

For simplicity, the processing of a substrate to form transistors using FEOL and processing of lower ILD level and lower levels of an upper ILD level using BEOL are not shown. Referring to FIG. 5a, the process 500 is at the stage of providing a dielectric layer 490 over a substrate (not shown). The dielectric layer 490, for example, may correspond to upper ILD level 4 having via level V3 and metal level M4. For the sake of simplicity and for illustration purpose, the dielectric layer 490 may be referred to as a first upper dielectric layer and its via and metal levels may be referred to as a first upper interconnect level. The dielectric layer 490 is formed of a low-k dielectric material such as SiCOH. Other suitable low-k dielectric materials may also be useful.

The process includes forming suitable trenches in the functional regions and non-functional regions. For example, trenches are formed in the first upper dielectric layer. A photoresist (not shown) is applied to the top surface of the first upper dielectric layer to define a pattern arrangement for fabricating the trenches. Portions of the first upper dielectric layer not protected by the photoresist are removed (e.g., by using an etching process) to form the trenches. The etching process, for example, may be an anisotropic etch, such as RIE. Other suitable removal process may also be employed.

In one embodiment, the trenches in the various regions are formed simultaneously. The trenches, for example, include the same depth dimension defined by, for example, 1× design rule. The depth of the trenches, for example, is about 850-1000 Å with reference to the top surface of the first upper dielectric layer based on 28 nm technology node. Other suitable depth dimensions may also be useful, depending on design requirement of a technology node.

The process continues by depositing a conductive layer on top of the first upper dielectric layer and filling the trenches. The conductive layer, for example, may be formed by chemical vapor deposition (CVD). The conductive layer, for example, includes Cu. Other suitable conductive materials and deposition techniques may also be employed. A chemical mechanical polishing (CMP) process is performed to remove excess conductive material on top of the first upper dielectric layer and to provide a substantially planar surface. The trenches filled with conductive material form a metal line 495 in the first and second functional regions 408 and 409 as well as proximate memory region 406 and external logic circuit region 407. Although one metal line is shown in the regions, it is understood that there could be more than one metal line being formed in the same metal level of the regions.

Referring to FIG. 5a, a dielectric liner 460 is formed above the first upper dielectric layer covering the metal lines 495 in the first and second functional and non-functional regions. The dielectric liner, for example, serves as an etch stop layer. The dielectric liner may be a low k dielectric liner. For example, the dielectric liner may be nBLOK. Other suitable types of dielectric materials for the dielectric liner may also be useful. The dielectric liner, for example, is formed by CVD. Other suitable techniques for forming the dielectric liner may also be useful.

The process continues to form a second upper dielectric layer 462. For example, the second upper dielectric layer is formed on the dielectric liner 460. The second upper dielectric layer, in one embodiment, includes a low-k dielectric material, such as SiCOH. The second upper dielectric layer may be formed by CVD. Any other suitable forming techniques or suitable low-k materials and thicknesses for the second upper dielectric layer may also be useful.

Figure 5B:
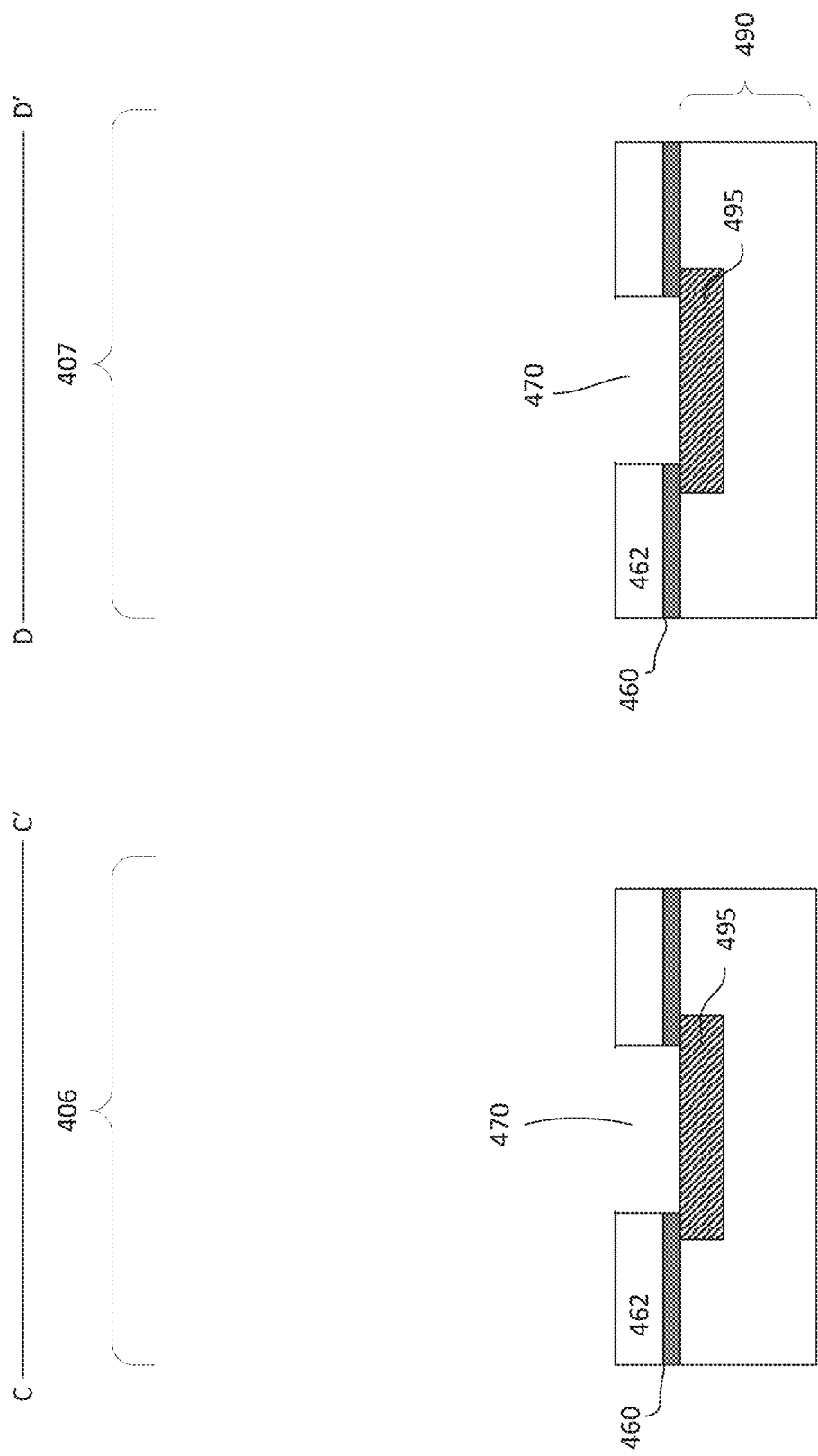

In FIG. 5b, the second upper dielectric layer 462 and the dielectric liner 460 in the regions 406 and 407 and the first functional region 408 (not shown) are patterned to form trench openings 470. In one embodiment, the openings 470 include sufficient depth to accommodate a bottom electrode. The trenches may be formed by mask and etch techniques. For example, a patterned photoresist mask may be formed over the second upper dielectric layer, serving as an etch mask. An etch, such as RIE, may be performed to pattern the second upper dielectric layer and dielectric liner using the patterned resist etch mask. As shown, the etch stops when it reaches a top surface of the metal line 495. The metal line 495, for example, serves as an etch stop for the trench openings 470.

The process continues by depositing a conductive layer over the first and second functional and non-functional regions. For example, the conductive layer is conformally formed over a top surface of the first and second functional and non-functional regions and fills the trench openings in the regions 406 and 407 and the first functional region 408 (not shown). The conductive layer, for example, may include Ti, TiN, Ta or TaN and may be formed by physical vapor deposition (PVD). Other suitable conductive materials and deposition techniques may also be employed. A CMP process is performed to remove excess conductive material on top of the second upper dielectric layer and to provide a substantially planar top surface. As shown in FIG. 5c, the CMP process removes the conductive layer over the top surface and defines the bottom electrode 431 in the proximate memory region 406 and external logic circuit region 407 as well as the first functional region 408 (not shown).

Figure 5D:
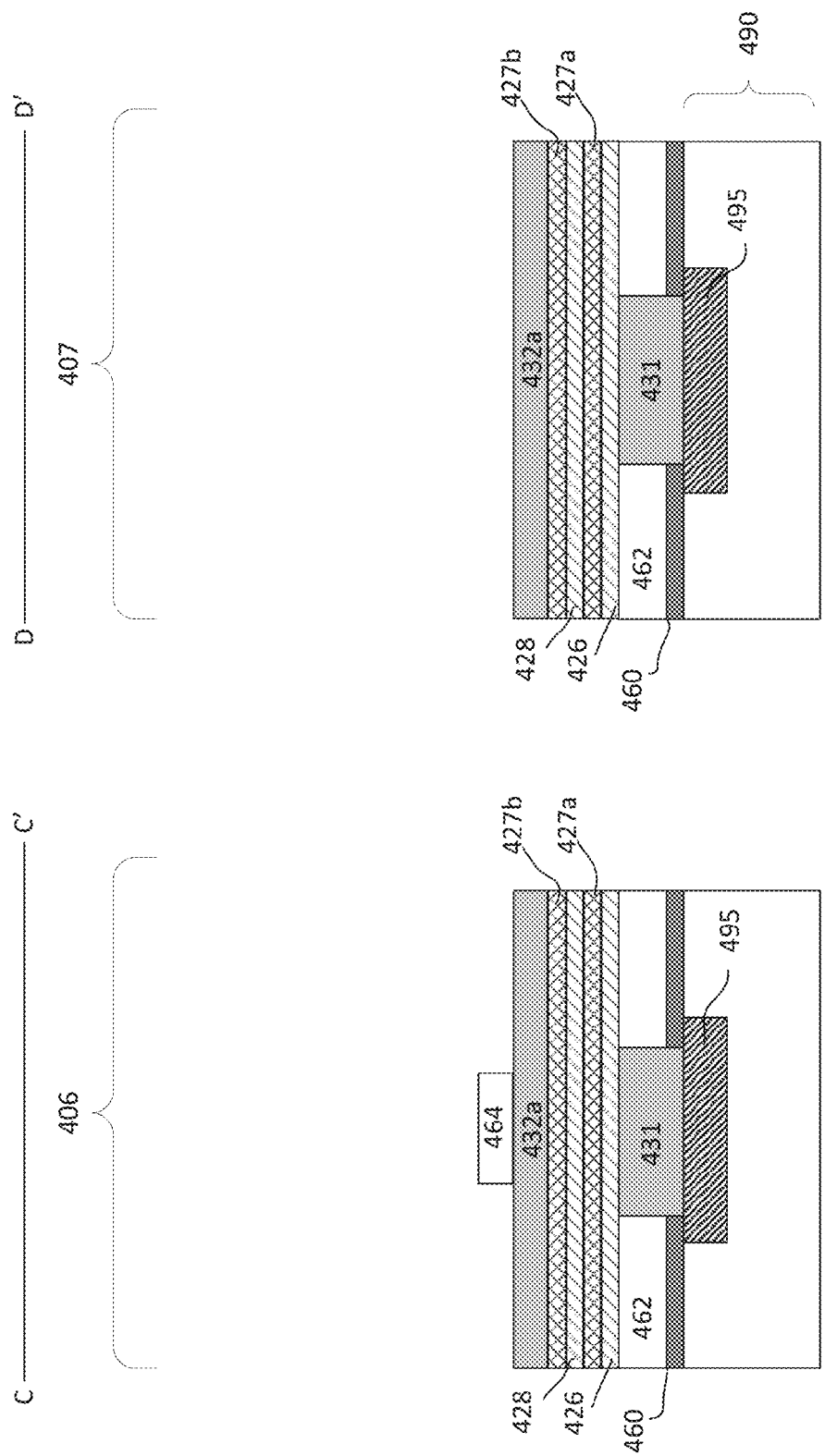

The process continues to form MTJ stack of the MRAM cell in region 408 (not shown) and first type dummy structures in region 406. Various layers of the MTJ stack are formed on the second upper dielectric layer 462 as shown in FIG. 5d. For example, various layers of the MTJ stack are sequentially formed over the second upper dielectric layer in the functional and non-functional regions. An exemplary MTJ stack includes a magnetically fixed layer 426 separated from a magnetically free layer 428 by a first tunneling barrier layer 427a, and a second tunneling barrier layer 427b. As shown in FIG. 5d, various layers of the MTJ stack 426, 427a, 428, and 427b, a top electrode layer 432a and a hard mask layer 464 are formed over the second upper dielectric layer 462 by PVD process. Other suitable techniques may also be used. The MTJ stack, for example, is shown to include four layers having materials the same as described in FIGS. 4a-4c. It is understood that the MTJ stack may include other suitable number of layers and other suitable materials. The top electrode layer 432a, for example, may include the same material as the bottom electrode while the hard mask layer 464, for example, includes an oxide material.

The process continues to pattern the hard mask layer 464, top electrode layer 432a and the MTJ stack layers as shown in FIG. 5e. Patterning the layers may be achieved with mask and etch techniques. A soft mask, such as a photoresist layer, is formed on the hard mask layer. The soft mask is patterned to define the top electrode and MTJ stack layers. To form the pattern in the mask layer, it may be selectively exposed with an exposure source using a reticle. The patterned hard mask 464 is used to define the top electrode and MTJ stack of the memory cell in region 408 (not shown) and first type dummy structure in region 406.

As shown in FIG. 5e, the patterned mask is used define the top electrode 432a, free layer 428, tunneling barrier layers 427a and 427b, and fixed layer 426 of the magnetic dummy structure in the region 406 and the MTJ element in region 408 (not shown) by removing portions of the layers not protected by the patterned hard mask 464. The top electrode layer 432a, the tunneling barrier layers 427a and 427b, the free layer 428 and the fixed layer 426 of the MTJ stack are completely removed from region 409 (not shown) and region 407. Other suitable techniques for patterning the layers of the MTJ stack and top electrode layer may also be useful. The patterned mask is removed using suitable techniques, such as ashing.

The process continues by depositing an encapsulation liner 466 over the patterned MTJ stack and top electrode in region 406 and in region 408 (not shown) while covering the bottom electrodes in region 407 as shown in FIG. 5e and region 409 (not shown). As shown, the encapsulation liner covers exposed surfaces of the bottom electrode 431, second upper dielectric layer 462, top electrode 432a, the MTJ stack layers (e.g., 426, 427a, 428 and 427b), and hard mask 464. The encapsulation liner 466, for example, may be formed by CVD and serves as an etch stop layer or protective layer during subsequent processing. The encapsulation liner may be a low k dielectric liner such as nBLOK. Other suitable types of dielectric materials for the encapsulation liner and forming techniques may also be useful.

A third upper dielectric layer 468 is formed over the encapsulation liner 466 in regions 406 and 407 as shown in FIG. 5*f* and regions 408 and 409 (not shown). The third upper dielectric layer, for example, includes a low-k dielectric material which is the same material as the second upper dielectric layer. The third upper dielectric layer may be formed by CVD and includes a thickness sufficient to cover the patterned MTJ stack and top electrode 432*a* in region 406 and in region 408 (not shown). Other suitable dielectric materials and techniques may be used for forming the third upper dielectric layer. A planarization process is performed to remove excess third upper dielectric layer 468. The planarization process, for example, may be achieved by CMP. Other suitable techniques may also be useful. The planarization process produces a substantially planar top surface. As shown, the planarization process removes a top portion of the encapsulation liner 466 and hard mask 464 until a top surface of the top electrode 432*a* is exposed in the region 406 as shown in FIG. 5*f* and region 408 (not shown). The planarized third upper dielectric layer 468, for example, surrounds and covers the sides of the MTJ stack.

Figure 5G:
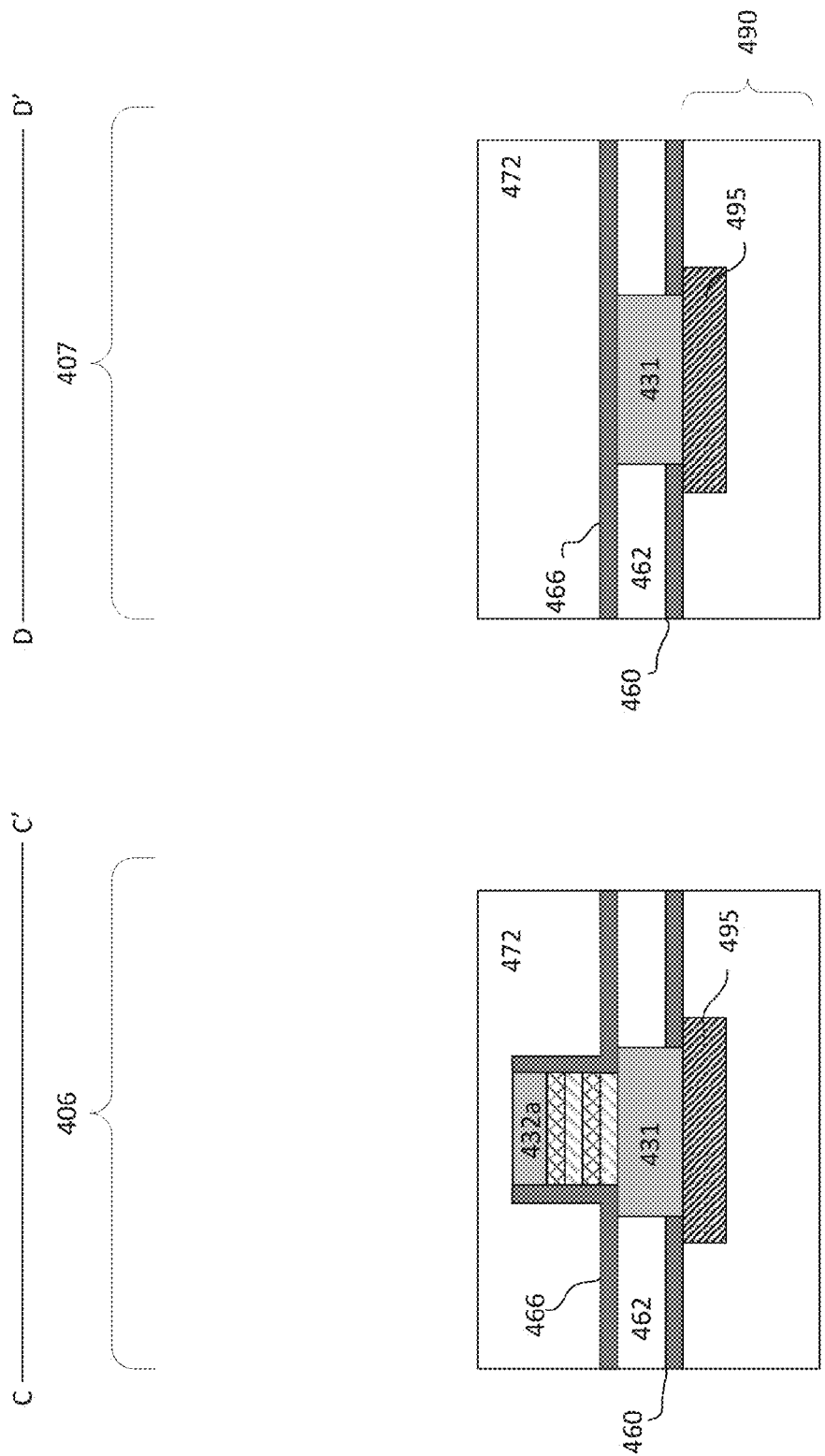

The top electrode and the MTJ stack are formed in a via level (e.g., V4) of an ILD level. The top electrode and the MTJ stack may not be sufficiently thick to match the height of a via contact to be formed in the second functional (or functional logic) region 409. In such case, after the planarization process, the process 500 may continue to form a fourth upper dielectric layer 472 as shown in FIG. 5*g*. The fourth upper dielectric layer, for example, includes a low-k dielectric material which is the same material as the second and third upper dielectric layers. The fourth upper dielectric layer may be formed by CVD. Other suitable dielectric materials and techniques may be used for forming the fourth upper dielectric layer.

In one embodiment, the fourth upper dielectric layer 472 is patterned to form trench openings 475 in regions 406 and 407 as shown in FIG. 5*h* and in region 408 (not shown). The trench opening 475, for example, exposes the top electrode 432*a* and a portion of the encapsulation liner 466 in region 406 and region 408 (not shown). The trench openings may be formed by mask and etch techniques. For example, a patterned photoresist mask (not shown) may be formed over the fourth upper dielectric layer, serving as an etch mask. An etch, such as RIE, may be performed to pattern the fourth upper dielectric layer using the patterned resist etch mask. The trench openings, for example, should be sufficiently wide and deep to accommodate an additional top electrode later.

Figure 5I:
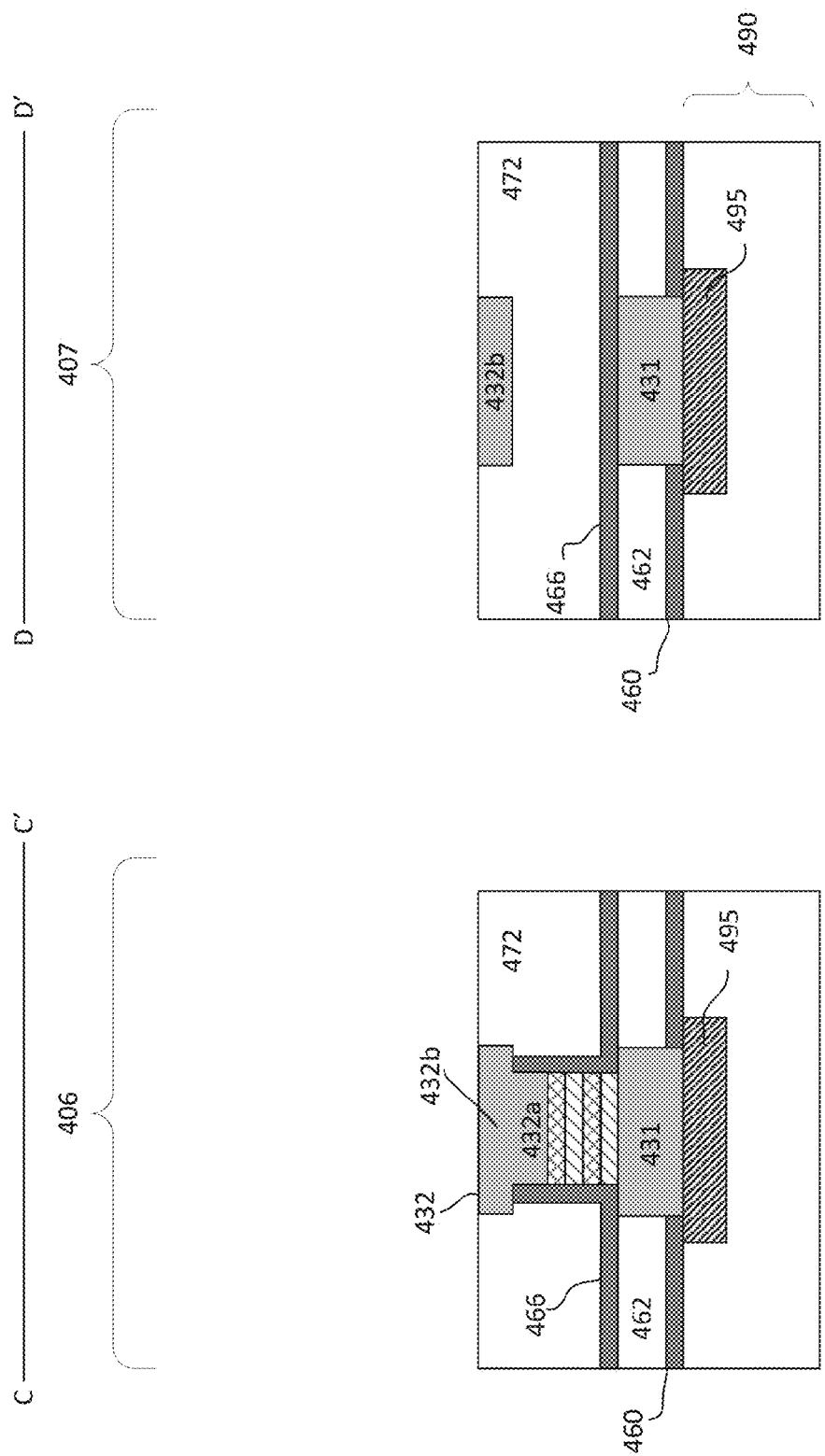

The process 500 continues by forming an additional top electrode layer. The additional top electrode layer, for example, includes the same material and is formed by the same technique used for forming the top electrode 432*a*. The additional top electrode layer is deposited over the functional and non-functional regions and fills the trench openings in regions 406 and 407 as shown in FIG. 5*i* and region 408 (not shown). A planarization process is performed to remove excess top electrode layer. The planarization process, for example, may be achieved by CMP. Other suitable techniques may also be useful. The planarization process produces a substantially planar top surface in regions 406, 407 and 408 and completely removes the additional top electrode layer from region 409 (not shown). As shown, the planarization process is performed until it reaches a top surface of the fourth upper dielectric layer 472 as shown in FIG. 5*i*. As shown, the planarization process defines the upper top electrode portion 432*b* having a top surface substantially coplanar with top surface of the fourth upper dielectric layer 432*b*. Thus, the top electrode 432 in regions 406 and 408 includes an upper top electrode portion 432*b* and a lower top electrode portion 432*a* while the top electrode in region 407 includes the upper top electrode portion 432*b*. Thus, the MTJ element 410 in region 408, the magnetic dummy structure 414 in region 406, and the non-magnetic dummy structure 418 in region 407 enable a planarized surface across the dielectric layer 472 with high flatness to be achieved during the CMP process, thereby avoiding or minimizing "dishing" effect.

Figure 5J:
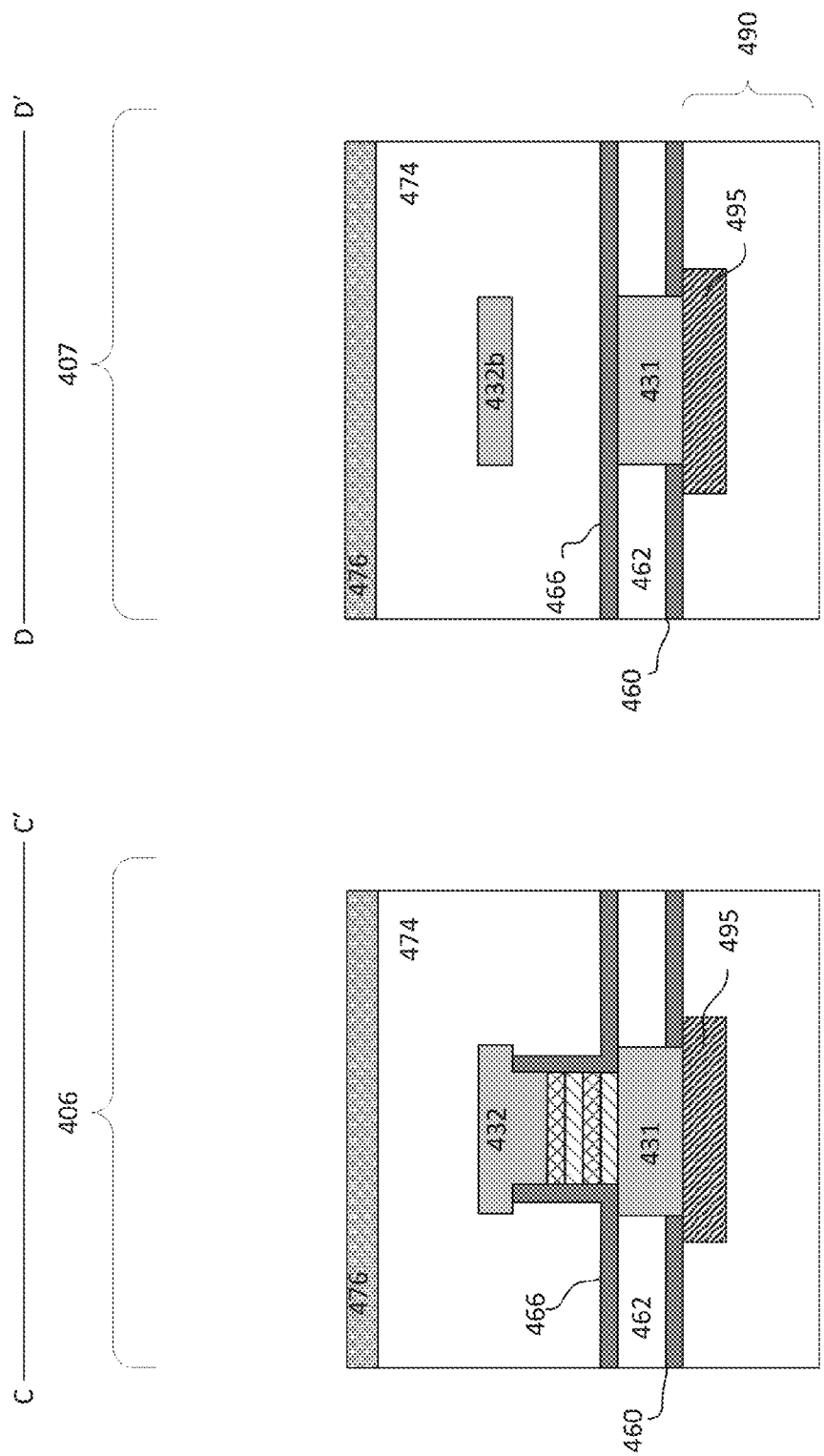

Referring to FIG. 5*j*, a fifth upper dielectric layer and a hard mask layer 476 are formed over the fourth upper dielectric layer 472 and sufficiently covers the top electrode 432 in regions 406 and 408 and the top electrode 432*b* in region 407. The fifth upper dielectric layer, for example, includes the same material and formed using the same technique such as that described with respect to the second, third and fourth upper dielectric layers while the hard mask layer 476 includes an oxide material. The fifth upper dielectric layer, for example, is sufficiently thick to accommodate metal lines disposed in a metal level (e.g., M5). The third, fourth and fifth upper dielectric layers in combination, for example, may be referred to as a dielectric layer 474. The dielectric layer 474 and the second upper dielectric layer 462 in combination, for example, corresponds to upper ILD level 5.

In one embodiment, the process continues to form dual damascene opening having a trench and a via opening in the dielectric layer 474 in the region 409 (not shown) and damascene opening having a trench 478 in regions 406 and 407 as shown in FIG. 5*j* and in region 408 (not shown). The dual damascene opening may be formed by via first or via last process. By way of example, a first removal process may be performed using suitable mask and etch technique to form a via opening in region 409. The first removal process, for example, removes exposed portions of the dielectric liner 460, second, third, fourth and fifth upper dielectric layers and encapsulation liner 466 until a portion of the metal line 495 is exposed. A second removal process may be performed using suitable mask and etch technique to form trenches 478 in functional and non-functional regions simultaneously. The trenches 478, for example, may be defined based on 2× design rule. The trenches may be formed by mask and etch techniques. The second removal process, for example, may employ an etch which is highly selective to the material of the fifth dielectric layer to remove exposed portions of the dielectric layer to form the trenches. As shown, the etch forms the trenches 478 in functional and non-functional regions and stops when it reaches the top surface of the top electrode 432*b*. Thus, the trenches in the various regions, for example, are formed by the same etch process. The trench in region 409 is in communication with the via opening which is in communication with the metal line 495 while the trenches 478 in regions 406, 407 and 408 are in communication with the top electrode 432*b* as shown in FIG. 5*k*. The hard mask 476 may be removed by, for example, ashing.

A conductive layer is formed. The conductive layer covers the dielectric layer 474 as well as filling the trenches and via opening. For example, the conductive layer fills the trenches in regions 406, 407 and 408 and fills both the trench and via opening in region 409. The conductive layer should be sufficiently thick to fill the trenches and via opening. The conductive layer, for example, includes copper. Other suitable conductive materials may also be useful. Excess conductive material is removed by CMP, forming metal lines 496 in regions 406, 407 and 408 while forming metal line and via contact in region 409. The top surface of the metal lines 496 is substantially planar with the top surface of the dielectric layer 474 as shown in FIG. 5*l*. A dielectric liner 480 may be formed to cover the metal lines 496 and top surface of the dielectric layer 474 as shown.

The process continues to complete formation of the IC. The process, for example, may continue to form passivation layer and pad interconnects or bonding pads. Further processing can include final passivation, dicing, assembly and packaging. Other processes are also useful.

In some of the drawings or illustrations, the device may be shown to include one memory cell, one first type dummy structure and one second type dummy structure. However, it is understood that a device may include numerous memory cells and first and second type dummy structures integrated into the same IC. Although as described, the storage element and the magnetism controllable dummy structures are disposed in specified ILD level of the back end dielectric layer, other configurations may also be useful. For example, the storage element and dummy structures may be disposed in other suitable ILD level.

The embodiments as described in the present disclosure result in various advantages. The non-magnetic dummy structures exclude the electrical-magnetic interaction between the memory and logic components, such as the BEOL capacitance and inductor. The non-magnetic dummy structures would also prevent the potential Lorentz-Force induced metal resistance deviation and electrical-magnetic failure. The magnetic dummy structures disposed in the proximate memory region surrounding the array region provide uniform magnetic field to the MTJ elements of the memory cell on the boundary of the array region. The presence of the magnetic dummy structures in the proximate memory region surrounding the array region which have the same structure as the active MTJ elements in the array region as well as the non-magnetic dummy structure which keep the top and bottom electrodes enable a planarized top surface with high flatness to be achieved during chemical mechanical polishing process. This eliminates the CMP dishing effect which is undesirable.

The process as described is highly compatible with MRAM, MTJ, standard BEOL process and logic processing or technology. The process allows, magnetic and non-magnetic dummy structures to be formed concurrently on the same substrate using MRAM and logic processing without compromising the reliabilities of the memory cell and other components in the logic region. Moreover, the process as described integrates magnetism controllable dummy structures with MRAM cell and logic components in the same chip without the need of additional mask. In some embodiments, in the case where the total thickness of the top electrode and the MTJ stack is sufficient to match the thickness of the via contact of the logic component in the same via level, a separate mask to define the upper top electrode portion may be avoided. This further reduces the manufacturing cost.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a substrate defined with first and second functional regions and first and second non-functional regions, wherein the first non-functional region corresponds to a proximate memory region which is proximate to and surrounds the first functional region and the second non-functional region corresponds to an external logic circuit region which surrounds at least the second functional region;
forming a magnetic memory element in the first functional region and a logic element in the second functional region; and
forming a plurality of magnetism controllable dummy structures in the proximate memory region and external logic circuit region, wherein the magnetism controllable dummy structures provide uniform magnetic field to the magnetic memory element and prevents electrical-magnetic interaction between the magnetic memory and logic elements on the same substrate.

2. The method of claim 1 wherein forming the magnetic memory element comprises forming a magnetic tunnel junction (MTJ) element which comprises a first electrode, a second electrode, and a MTJ stack between the first and second electrodes.

3. The method of claim 2 wherein the MTJ stack comprises at least a magnetically free layer, a magnetically fixed layer, and a tunneling barrier layer between the free and fixed layers.

4. The method of claim 2 wherein forming the magnetism controllable dummy structures comprise forming first type dummy structures in the proximate memory region and forming second type dummy structures in the external logic circuit region.

5. The method of claim 4 wherein the first type dummy structures comprise magnetic dummy structures and the second type dummy structures comprise non-magnetic dummy structures.

6. The method of claim 5 wherein the first type dummy structures comprise a dummy fill structure which is the same as the MTJ element of the magnetic memory element.

7. The method of claim 5 wherein the second type dummy structures comprise a dummy fill structure which is similar as the MTJ element of the magnetic memory element.

8. The method of claim 7 wherein the second type dummy structures comprise a first electrode and a second electrode without a MTJ stack in between the first and second electrodes.

9. A method of forming a device comprising:
providing a substrate defined with first and second functional regions and first and second non-functional regions, wherein the first non-functional region corresponds to a proximate memory region which is proximate to and surrounds the first functional region and the second non-functional region corresponds to an external logic circuit region which surrounds at least the second functional region;
providing a first upper dielectric layer over the first and second functional and non-functional regions of the substrate, wherein the first upper dielectric layer comprises a first upper interconnect level with a plurality of metal lines in the first and second functional and non-functional regions;
forming a magnetic memory element over the first upper dielectric layer in the first functional region and a logic element over the first upper dielectric layer in the second functional region; and forming a plurality of magnetism controllable dummy structures over the first upper dielectric layer in the first and second non-functional regions, wherein the magnetism controllable dummy structures provide uniform magnetic field to the magnetic memory element and prevents electrical-magnetic interaction between the magnetic memory and logic elements on the same substrate.

10. The method of claim 9 wherein:
forming the magnetic memory element comprises forming a magnetic tunnel junction (MTJ) element sandwiched between top and bottom electrodes over the first upper dielectric layer, wherein the bottom electrode is in direct contact with the metal line in the first upper interconnect level of the first functional region; and
providing a dielectric layer over at least the first and second functional regions and covering the first upper dielectric layer, wherein the dielectric layer comprises a second upper interconnect level with a dual damascene interconnect in the second functional region and a damascene interconnect in the first functional region, wherein the dual damascene interconnect in the second functional region is formed over and is coupled to the metal line in the second functional region and the damascene interconnect in the first functional region is coupled to the MTJ element.

11. The method of claim 10 wherein forming the magnetism controllable dummy structures comprise forming first type dummy structures in the proximate memory region and forming second type dummy structures in the external logic circuit region.

12. The method of claim 11 wherein the first type dummy structures comprise a dummy fill structure which is the same as the MTJ element of the magnetic memory element and the second type dummy structures comprise a dummy fill structure which is similar as the MTJ element of the magnetic memory element.

13. The method of claim 12 wherein the magnetic memory element in the first functional region, the first type dummy structures in the proximate memory region and the second type dummy structures in the external logic circuit region are concurrently formed in the same substrate.

14. The method of claim 12 wherein providing the dielectric layer comprises:
forming a second upper dielectric layer over the first and second functional regions, proximate memory region and external logic circuit region covering the first upper dielectric layer;
patterning the second upper dielectric layer to simultaneously form trench openings at least in the proximate memory region and external logic circuit region, wherein the trench openings extend from a top surface of the second upper dielectric layer to a top surface of the metal line in the proximate memory region and external logic circuit region which accommodate the bottom electrode;
forming a bottom electrode layer over the second upper dielectric layer and fills the trench openings; and
performing a planarization process to remove excess bottom electrode layer to define the bottom electrodes in the proximate memory region and external logic circuit region.

15. The method of claim 14 comprising:
forming various layers of the MTJ stack at least over the proximate memory region and external logic circuit region;

forming a top electrode layer and a hard mask layer over the various layers of the MTJ stack; and
patterning the top electrode layer and various layers of the MTJ stack which comprises
providing a mask over the top electrode layer, and
performing an etch process to remove exposed portions of the top electrode layer and MTJ stack not protected by the mask in the proximate memory region and completely removes the top electrode and various layers of the MTJ stack from the external logic circuit region.

16. The method of claim 15 comprising:
forming an additional upper dielectric layer over at least the first and second functional region, proximate memory region and external logic circuit region;
patterning the additional upper dielectric layer to form trench openings in the proximate memory region and external logic circuit region;
forming an additional top electrode layer over the proximate memory region and external logic circuit region, wherein the additional top electrode layer fills the trench openings in the additional upper dielectric layer; and
performing a planarization process to remove excess additional top electrode layer to define an upper top electrode portion in the proximate memory region and to define a top electrode in the external logic circuit region, wherein the top electrode, MTJ stack and bottom electrode in the proximate memory region corresponds to the first type dummy structure while the top electrode, bottom electrode and dielectric material of the additional upper dielectric layer in between the top and bottom electrodes in the external logic circuit region correspond to the second type dummy structure.

17. A device comprising:
a substrate defined with first and second functional regions and first and second non-functional regions, wherein the first non-functional region corresponds to a proximate memory region which is proximate to and surrounds the first functional region and the second non-functional region corresponds to an external logic circuit region which surrounds at least the second functional region;
a magnetic memory element disposed in the first functional region and a logic element disposed in the second functional region; and
a plurality of magnetism controllable dummy structures disposed in the proximate memory region and external logic circuit region, wherein the magnetism controllable dummy structures provide uniform magnetic field to the magnetic memory element and prevents electrical-magnetic interaction between the magnetic memory and logic elements on the same substrate.

18. The device of claim 17 wherein the magnetic memory element comprises a magnetic tunnel junction (MTJ) element which comprises a first electrode, a second electrode, and a MTJ stack between the first and second electrodes.

19. The device of claim 18 wherein the magnetism controllable dummy structures comprise first type dummy structures disposed in the proximate memory region and second type dummy structures disposed in the external logic circuit region.

20. The device of claim 19 wherein the first type dummy structures comprise magnetic dummy structures and the second type dummy structures comprise non-magnetic dummy structures.

* * * * *